(12) United States Patent
Nagasawa et al.

(10) Patent No.: US 10,833,060 B2
(45) Date of Patent: Nov. 10, 2020

(54) SEMICONDUCTOR STORAGE DEVICE

(71) Applicant: Toshiba Memory Corporation, Minato-ku (JP)

(72) Inventors: Kazuya Nagasawa, Kamakura (JP); Norihiro Ishii, Akishima (JP); Seiji Kawahara, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/299,393

(22) Filed: Mar. 12, 2019

(65) Prior Publication Data

US 2020/0027866 A1 Jan. 23, 2020

(30) Foreign Application Priority Data

Jul. 18, 2018 (JP) .................. 2018-135298

(51) Int. Cl.
*H01L 25/18* (2006.01)
*H01L 23/498* (2006.01)
*H01L 23/538* (2006.01)

(52) U.S. Cl.
CPC ........ *H01L 25/18* (2013.01); *H01L 23/49816* (2013.01); *H01L 23/5385* (2013.01); *H01L 23/5386* (2013.01); *H01L 23/5387* (2013.01)

(58) Field of Classification Search
CPC ............... H01L 25/18; H01L 23/49816; H01L 23/5385; H01L 23/5386; H01L 23/5387
USPC ...................................................... 257/773
See application file for complete search history.

(56) References Cited

U.S. PATENT DOCUMENTS

| | | | |
|---|---|---|---|
| 5,448,511 | A | 9/1995 | Paurus et al. |
| 6,080,936 | A | 6/2000 | Yamasaki et al. |
| 8,338,715 | B2 | 12/2012 | Hirano et al. |
| 9,402,303 | B2 | 7/2016 | Qian et al. |
| 2009/0175019 | A1 | 7/2009 | Koyama et al. |
| 2012/0293470 | A1 | 11/2012 | Nakata |
| 2019/0317567 | A1* | 10/2019 | Schnell .............. G06F 1/185 |

FOREIGN PATENT DOCUMENTS

| | | |
|---|---|---|
| JP | 8-330683 | 12/1996 |
| JP | 2001-119114 | 4/2001 |
| TW | 524030 | 3/2003 |
| TW | 200950609 A1 | 12/2009 |

* cited by examiner

*Primary Examiner* — Tu-Tu V Ho
(74) *Attorney, Agent, or Firm* — Oblon, McClelland, Maier & Neustadt, L.L.P.

(57) ABSTRACT

According to one embodiment a semiconductor storage device includes a housing, a first rigid board, a controller, a second rigid hoard, a first semiconductor memory component, and a first connection board. The first rigid board includes a plurality of first terminals on a surface of the first rigid board. The second rigid board includes a plurality of second terminals on a surface of the second rigid board. The first connection board is in a state in which at least a part of the first connection board is bent. The first connection board includes a first end portion and a second end portion. The first end portion includes a plurality of third terminals connected to the plurality of first terminals of the first rigid board. The second end portion includes a plurality of fourth terminals connected to the plurality of second terminals of the second rigid board.

15 Claims, 18 Drawing Sheets

US 10,833,060 B2

SEMICONDUCTOR STORAGE DEVICE

CROSS-REFERENCE TO RELATED APPLICATION

This application is based upon and claims the benefit of priority from Japanese Patent Application No. 2018-135298, filed Jul. 18, 2018; the entire contents of which are incorporated herein by reference.

FIELD

Embodiments described herein relate generally to a semiconductor storage device.

BACKGROUND

A semiconductor storage device in which a plurality of boards are connected by a connector is known.

DETAILED DESCRIPTION

According to one embodiment, a semiconductor storage device includes a housing, a first rigid board, a controller, a second rigid board, a first semiconductor memory component, and a first connection board. The first connection board is in the housing. The first rigid hoard includes a plurality of first terminals on a surface of the first rigid board. The controller is on the first rigid board. The second rigid board is in the housing. The second rigid board faces at least in part the first rigid board. The second rigid board includes a plurality of second terminals on a surface of the second rigid board. The first semiconductor memory component is on the second rigid board. The first semiconductor memory component is configured to be controlled by the controller. The first connection board is in the housing in a state in which at least a part of the first connection board is bent. The first connection board includes a first end portion and a second end portion. The first end portion includes a plurality of third terminals connected to the plurality of first terminals of the first rigid board. The second end portion includes a plurality of fourth terminals connected to the plurality of second terminals of the second rigid board.

Hereinafter, semiconductor storage devices according to embodiments will be described with reference to the accompanying drawings. In the following description, elements having the same or similar functions will be referred to by the same reference signs. Description of such elements may be omitted. In this specification, the term "face" includes a case in which there is no member interposed between two objects and a case in which there is a member (for example, a solder) interposed between two objects and the two objects face each other with the interposed member therebetween. In this specification, the term "connection" includes a case of electrical connection. In this specification, the term "flexibility" widely refers to characteristics in which a member is bent with an external force applied thereto and includes a case with elasticity and a case without elasticity. In this specification, the term "surface" is not limited to a front face. In some drawings, components which are mounted on a board (such as a controller and a NAND) are not illustrated.

Figure 1:
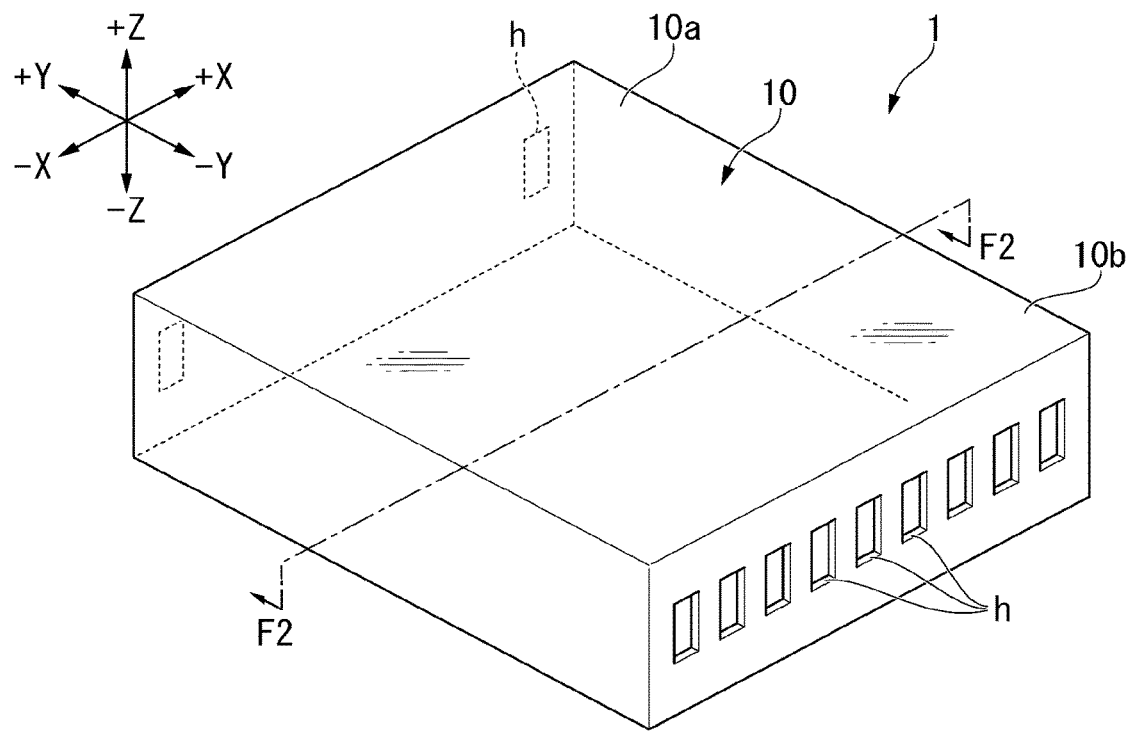
FIG. 1 is a perspective view illustrating a semiconductor storage device according to a first embodiment.
Figure 2:
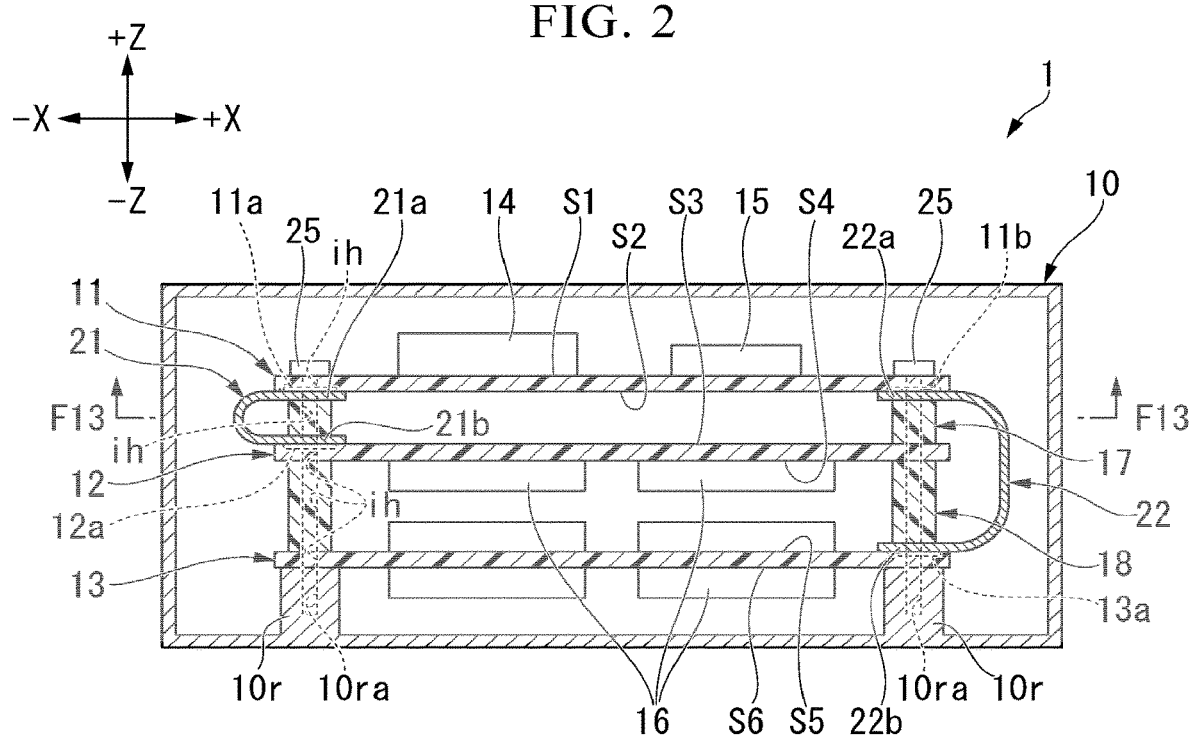
FIG. 2 is a sectional view taken along line F2-F2 of the semiconductor storage device illustrated in FIG. 1.

First, a +X direction, a −X direction, a +Y direction, a −Y direction, a +Z direction, and a −Z direction will be defined with reference to FIGS. 1 and 2. The +X direction, the −X direction, the +Y direction, and the −Y direction are directions which are along a first principal surface S1 of a first rigid board 11 which will be described later. The +X direction is defined as, for example, a direction from an end of the first rigid board 11 to which a first flexible board 21 is attached to an end to which a second flexible board 22 is attached. The −X direction is a direction opposite to the +X direction. The +X direction and the −X direction are simply referred to as an "X direction" when the directions are not distinguished from each other. The +Y direction and the −Y direction are directions which cross (for example, are substantially perpendicular to) the X direction. The +Y direction is defined as, for example, a direction from a controller 14 to an external connector (not illustrated) of a semiconductor storage device 1. The −Y direction is a direction opposite to the +Y direction. The +Y direction and the −Y direction are simply referred to as a "Y direction" when the directions are not distinguished from each other. In the following embodiments, the semiconductor storage device 1 has a rectangular parallelepiped shape. In this case, the Y direction is, for example, a longitudinal direction of the semiconductor storage device 1. The +Z direction and the −Z direction are directions which cross (for example, are substantially perpendicular to) the X direction and the Y direction. The +Z direction is a direction from a second rigid board 12 to the first rigid board 11. The −Z direction is a direction opposite to the +Z direction. The +Z direction and the −Z direction are simply referred to as a "Z direction" when the directions are not distinguished from each other. The Z direction is a thickness direction of each of first to third rigid boards 11, 12, and 13.

First Embodiment (1. Entire configuration)

A semiconductor storage device 1 according to a first embodiment will be described below with reference to FIGS. 1 to 13. The semiconductor storage device 1 is a storage device such as a solid state drive (SSD). The semiconductor storage device 1 is to be attached to an information processing device (a host device) such as a server device or a personal computer and is used as a storage area of the information processing device, for example.

FIG. 1 is a perspective view illustrating the semiconductor storage device 1. FIG. 2 is a sectional view taken along line F2-F2 of the semiconductor storage device 1 illustrated in FIG. 1. The semiconductor storage device 1 includes, for example, a housing (that is, casing) 10, first to third rigid boards 11, 12, and 13, a controller 14, a dynamic random access memory (DRAM) 15, a plurality of NAND type flash memories 16 (hereinafter referred to as "NANDs 16"), first and second spacers 17 and 18, and first and second flexible boards 21 and 22.

The housing 10 has a box shape. The housing 10 accommodates the first to third rigid boards 11, 12, and 13, the controller 14, the DRAM 15, the plurality of NANDs 16, the first and second spacers 17 and 18, and the first and second flexible boards 21 and 22. The housing 10 includes a first end portion 10a which is located on the +Y side and a second end portion 10b which is located on the −Y side (see FIG. 1). Ventilation holes h which are open in the Y direction are provided in the first end portion 10a and the second end portion 10b. Accordingly, a flow passage of air in the Y direction is formed in the housing 10.

Each of the first to third rigid boards 11, 12, and 13 includes a hard insulator and a conductor pattern which is disposed in the insulator. The first to third rigid boards 11, 12, and 13 are disposed to be substantially parallel to each other. The second rigid board 12 faces the first rigid board 11 in the Z direction. The third rigid board 13 is located on a side opposite to the first rigid board 11 with respect to the second rigid board 12, and faces the second rigid board 12 in the Z direction.

The first rigid board (for example, a mother board) 11 includes a first principal surface S1 and a second principal surface S2. The first principal surface S1 faces the inner surface of the housing 10. For example, the controller 14 and the DRAM 15 are mounted on the first principal surface S1. The second principal surface S2 is located on the side opposite to the first principal surface S1 and faces the second rigid board 12. The second principal surface S2 is an example of a "first surface." The second principal surface S2 includes a connection portion 11a to which the first flexible board 21 is connected and a connection portion 11b to which the second flexible board 22 is connected. The connection portion 11a is disposed, for example, in an end portion on the −X side of the first rigid board 11. The connection portion 11b is disposed, for example, in an end portion on the +X side of the first rigid board 11.

The second rigid board (for example, a first child board) 12 includes a third principal surface S3 and a fourth principal surface S4. The third principal surface S3 faces the second principal surface S2 of the first rigid board 11. The third principal surface S3 is an example of a "second surface." The third principal surface S3 includes a connection portion 12a to which the first flexible board 21 is connected. The connection portion 12a is disposed, for example, in an end portion on the −X side of the second rigid board 12. The fourth principal surface S4 is located on the side opposite to the third principal surface S3. For example, one or more NANDs 16 are mounted on the fourth principal surface S4.

The third rigid board (for example, a second child board) 13 includes a fifth principal surface S5 and a sixth principal surface S6. The fifth principal surface S5 faces the fourth principal surface S4 of the second rigid board 12. The fifth principal surface S5 includes a connection portion 13a to which the second flexible board 22 is connected. The connection portion 13a is disposed, for example, in an end portion on the +X side of the third rigid board 13. The sixth principal surface S6 is located on the side opposite to the fifth principal surface S5 and faces the inner surface of the housing 10. For example, one or more NANDs 16 are mounted on each of the fifth principal surface S5 and the sixth principal surface S6.

The controller 14 comprehensively controls the semiconductor storage device 1 as a whole. For example, the controller 14 is configured as a system on a chip (SoC) in which a host interface circuit for a host device, a control circuit that controls the DRAM 15, a control circuit that controls the plurality of NANDs 16, and the like are integrated in one semiconductor chip.

The DRAM 15 is an example of a volatile semiconductor memory chip. The DRAM 15 is a data buffer in which writing data received from the host device and reading data read from the NANDs 16 are temporarily stored. Here, the semiconductor storage device 1 may not be provided with the DRAM 15.

Each NAND 16 is an example of a nonvolatile semiconductor memory chip and is an example of a "semiconductor memory component." The "semiconductor memory component" is not limited to the example and may be a magnetoresistive random access memory (MRAM), a resistive random access memory (ReRAM), or the like.

The first spacer 17 is disposed between the first rigid board 11 and the second rigid board 12 and defines a distance between the first rigid board 11 and the second rigid board 12. The second spacer 18 is disposed between the second rigid board 12 and the third rigid board 13 and defines a distance between the second rigid board 12 and the third rigid board 13. The first spacer 17 is an example of a "first supporter." The second spacer 18 is an example of a "second supporter." The first and second spacers 17 and 18 will be described later.

In this embodiment, the housing 10 includes, for example, a plurality of receiving portions 10r. Each receiving portion 10r includes an engagement hole 10ra that can engage with a fixing member 25 such as a screw. Insertion holes ih through which the fixing member 25 passes are provided in the first to third rigid boards 11, 12, and 13 and the first and second spacers 17 and 18. The first to third rigid boards 11, 12, and 13 and the first and second spacers 17 and 18 arc fixed to the housing 10 together by the fixing members 25 passing through the insertion holes ih of these members 11, 12, 13, 17, and 18. The positions of the receiving portions 10r are not limited to the positions illustrated in FIG. 2, and they may be provided at corners of the housing 10. The fixing structure of the first to third rigid boards 11, 12, and 13 and the first and second spacers 17 and 18 are not limited to this example and a structure for connecting the members 11, 12, 13, 17, and 18 to each other and a structure for fixing the members 11, 12, 13, 17, and 18 to the housing 10 may be separately provided. In some drawings which will be described below, the insertion holes ih may not be illustrated.

Figure 3:
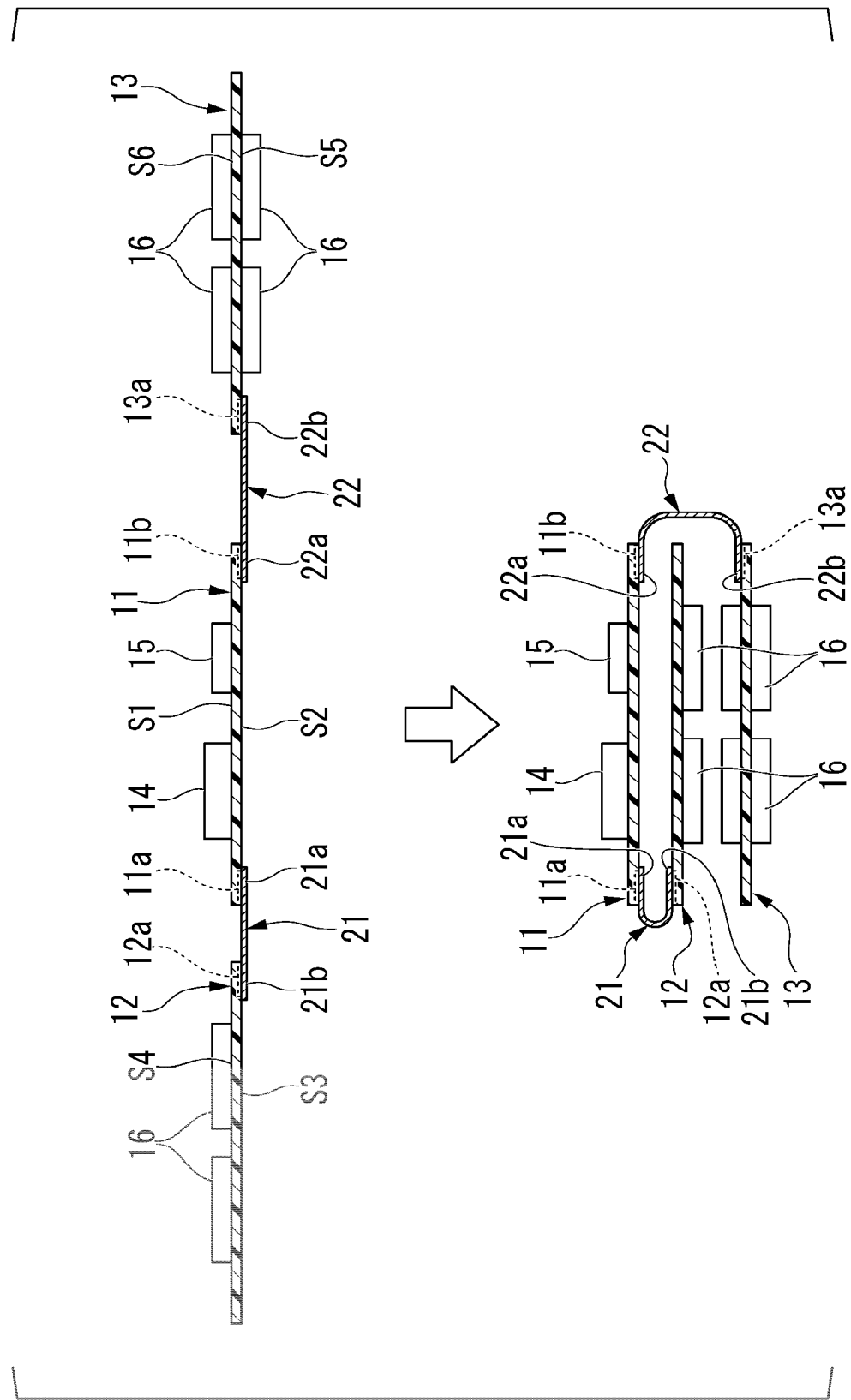
FIG. 3 is a sectional view illustrating a partial configuration of the semiconductor storage device according to the first embodiment.

FIG. 3 is a sectional view illustrating a partial configuration of the semiconductor storage device 1. Each of the first and second flexible boards 21 and 22 is a so-called flexible printed circuit (FPC) and includes, for example, a flexible insulating film and a conductor pattern covered with the insulating film.

The first flexible board 21 includes a first end portion 21a and a second end portion 21b. The first end portion 21a is fixed to the connection portion 11a of the second principal surface S2 of the first rigid board 11 (that is, a surface of the first rigid board 11). The second end portion 21b is fixed to the connection portion 12a of the third principal surface S3 of the second rigid board 12 (that is, a surface of the second rigid hoard 12). The first flexible hoard 21 has flexibility and is disposed in the housing 10 in a state in which at least a part of the first flexible board 21 is bent. The first rigid board 11 and the second rigid board 12 are electrically connected to each other via the first flexible board 21. The first flexible board 21 is an example of a "first connection board." The fixing structure of the first flexible board 21 to the first and second rigid boards 11 and 12 will be described later.

The second flexible board 22 includes a first end portion 22a and a second end portion 22b. The first end portion 22a is fixed to the connection portion 11b of the second principal surface S2 of the first rigid board 11 (that is, the surface of the first rigid board 11). The second end portion 22b is fixed to the connection portion 13a of the fifth principal surface S5 of the third rigid board 13 (that is, a surface of the third rigid board 13). The second flexible board 22 has flexibility and is disposed in the housing 10 in a state in which at least a part of the second flexible board 22 is bent. The first rigid board 11 and the third rigid board 13 are electrically connected to each other via the second flexible board 22. The second flexible board 22 is an example of a "second connection board." The fixing structure of the second flexible board 22 to the first and third rigid boards 11 and 13 is the same as the fixing structure of the first flexible board 21 to the first and second rigid boards 11 and 12.

Figure 4:
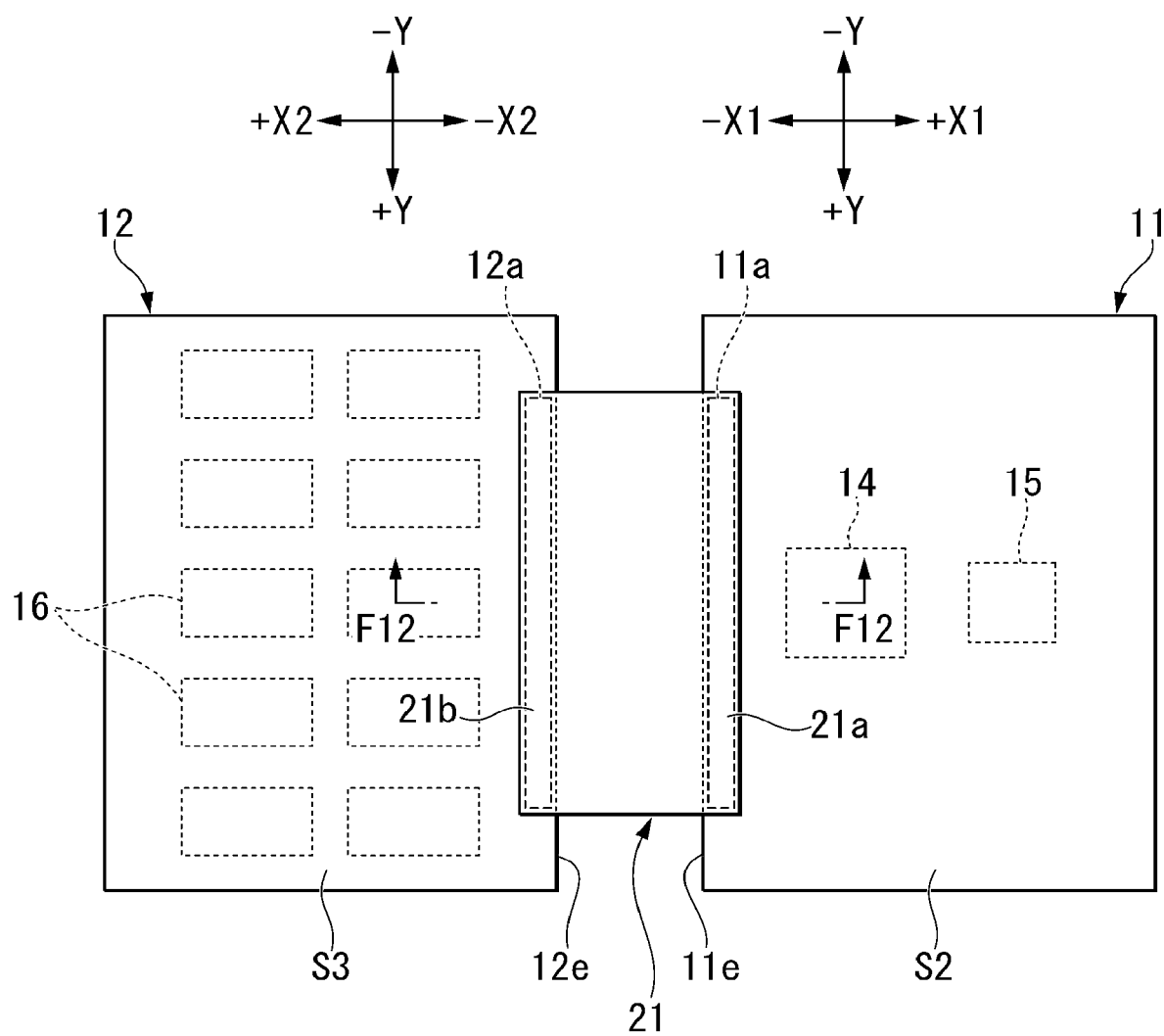
FIG. 4 is a plan view illustrating a first rigid board, a second rigid board, and a first flexible board in the first embodiment.

In this embodiment, the first and second flexible boards 21 and 22 are arranged substantially parallel to the Y direction (see FIGS. 2 and 4). Accordingly, the first and second flexible boards 21 and 22 are not likely to hinder a flow of air flowing in the housing 10 in the Y direction. Accordingly, it is possible to achieve improvement in heat flowability in the housing 10 and enhancement in heat dissipation performance of the semiconductor storage device 1.

(2. Fixing Structure of First Flexible Board)
(2.1 Configuration of Rigid Hoard)

FIG. 4 is a plan view illustrating the first rigid board 11, the second rigid board 12, and the first flexible board 21. FIG. 4 illustrates a state in which the first flexible board 21 is stretched flat. The first rigid board 11 includes a board edge 11e adjacent to the second rigid board 12 in the state in which the first flexible board 21 is stretched flat. Similarly, the second rigid board 12 includes a board edge 12e adjacent to the first rigid board 11 in the state in which the first flexible board 21 is stretched flat. The board edges 11c and 12c are substantially parallel to the Y direction.

Here, a +X1 direction, a −X1 direction, a +X2 direction, and a −X2 direction will be defined. The +X1 direction, the −X1 direction, the +X2 direction, and the −X2 direction are directions which are substantially parallel to the X direction. The +X1 direction is a direction from the board edge 11e of the first rigid board 11 to the inside (that is, an inner region) of the first rigid hoard 11. The −X1 direction is a direction opposite to the +X1 direction. The +X2 direction is a direction from the board edge 12e of the second rigid board 12 to the inside (that is, an inner region) of the second rigid board 12. The −X2 direction is a direction opposite to the +X2 direction.

Figure 5:
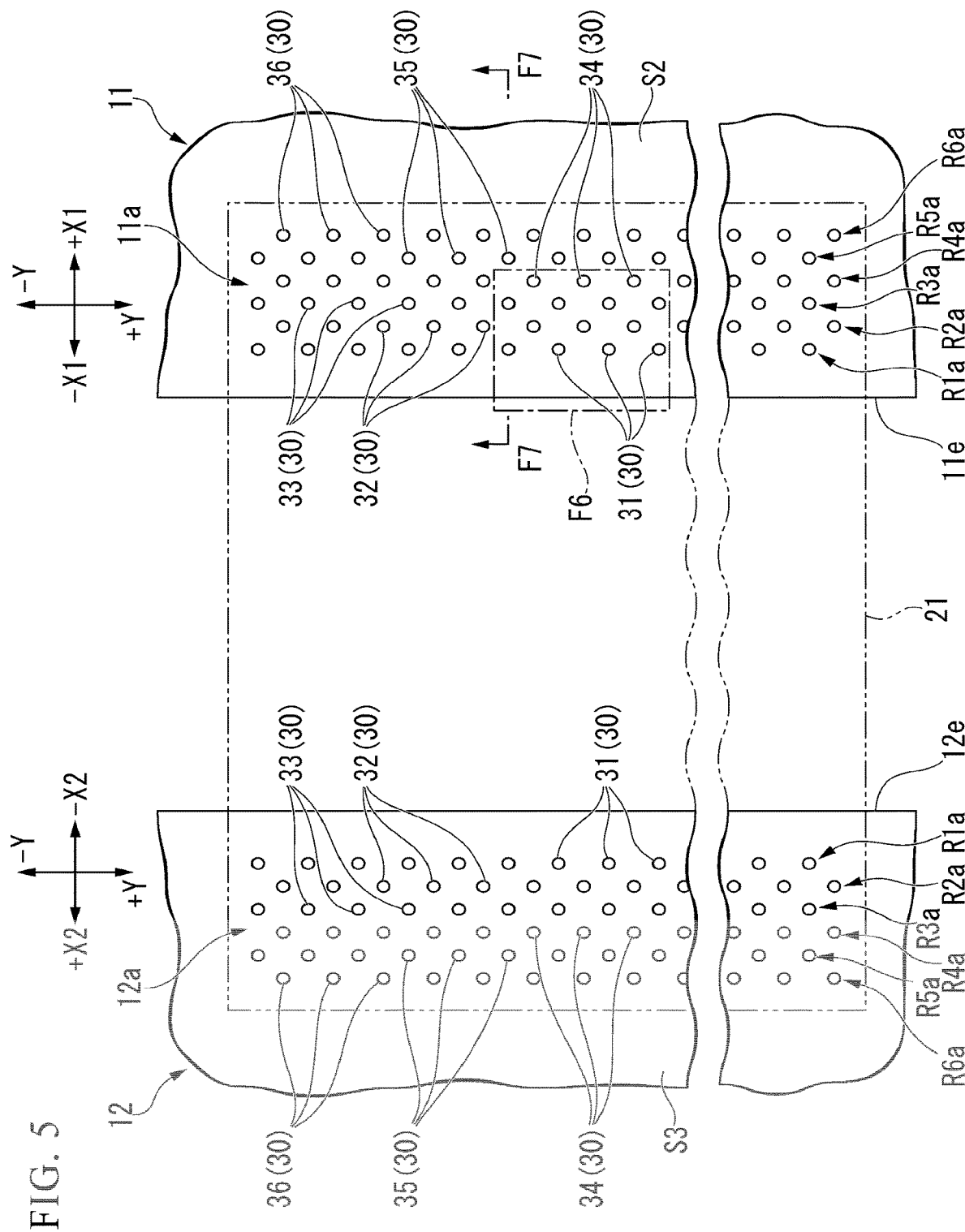
FIG. 5 is an enlarged plan view illustrating a connection portion between the first rigid board and the second rigid board in the first embodiment.

FIG. 5 is an enlarged plan view illustrating the connection portions 11a and 12a of the first rigid board 11 and the second rigid board 12. The connection portion 11a of the first rigid board 11 includes a plurality of pads 30 which are disposed on a surface of the first rigid board 11. Each of the plurality of pads 30 is an example of "terminal". In this embodiment, the plurality of pads 30 are separately arranged in first to sixth rows (that is, lines) R1a, R2a, R3a, R4a, R5a, and R6a. The first to sixth rows R1a, R2a, R3a, R4a, R5a, and R6a are sequentially arranged in this order in the +X1 direction and are substantially parallel to the board edge 11e. For example, the first row R1a is located closest to the board edge 11e among the first to sixth rows R1a, R2a, R3a, R4a, R5a, and R6a. The second row R2a is separated farther from the hoard edge 11e than the first row R1a. Similarly, the third row R3a, the fourth row R4a, the fifth row R5a, and the sixth row R6a are separated farther from the board edge 11e than the second row R2a, the third row R3a, the fourth row R4a, and the fifth row R5a, respectively.

The plurality of pads 30 include a plurality of pads 31 arranged in the first row R1a, a plurality of pads 32 arranged in the second row R2a, a plurality of pads 33 arranged in the third row R3a, a plurality of pads 34 arranged in the fourth row R4a, a plurality of pads 35 arranged in the fifth row R5a, and a plurality of pads 36 arranged in the sixth row R6a. The pads 31, the pads 32, the pads 33, the pads 34, the pads 35, and the pads 36 are arranged with the same intervals therebetween in the Y direction in the corresponding rows.

In this embodiment, the plurality of pads 30 are arranged in a zigzag pattern. That is, the plurality of pads 32 are disposed at positions which are shifted in the Y direction from the plurality of pads 31 (for example, positions which alternate with the plurality of pads 31 in the Y direction). The plurality of pads 33 are disposed at positions which are shifted in the Y direction from the plurality of pads 32 (for example, positions which alternate with the plurality of pads 32 in the Y direction). Similarly, the plurality of pads 34, the plurality of pads 35, and the plurality of pads 36 are disposed at positions which are shifted in the Y direction (for example, positions which alternate with the plurality of pads 30 in the Y direction) from the plurality of pads 30 in the rows adjacent thereto in the −X1 direction, respectively.

Figure 6:
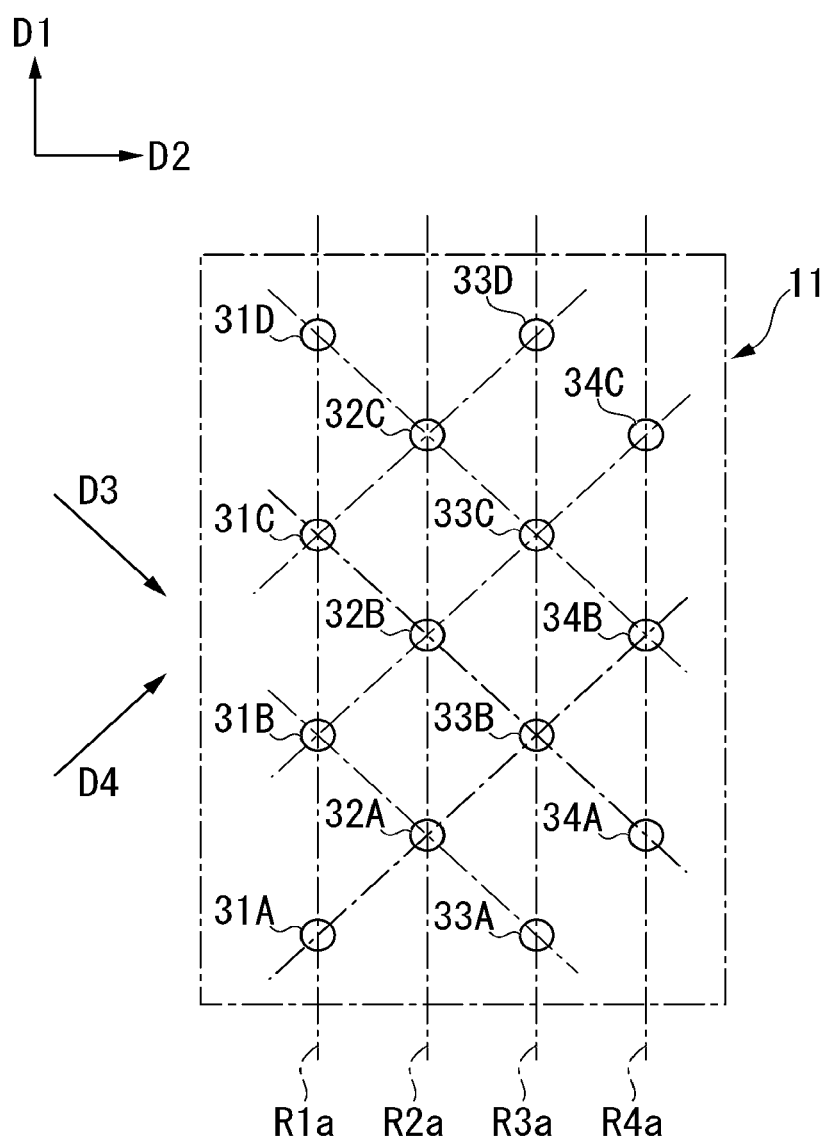
FIG. 6 is an enlarged plan view illustrating a region surrounded by line F6 of the first rigid hoard illustrated in FIG. 5.

FIG. 6 is an enlarged plan view illustrating a region surrounded by line F6 of the first rigid board 11 illustrated in FIG. 5. According to one aspect, the plurality of pads 30 include the plurality of pads 31, the plurality of pads 32, the plurality of pads 33, and the plurality of pads 34. The plurality of pads 31 are arranged in the first row R1a that is along a first direction D1. The plurality of pads 32 are arranged in the second row R2a. The second row R2a is separated from the first row R1a in a second direction D2 that is different from the first direction D1. The second row R2a is along the first direction D1. The plurality of pads 33 are arranged in the third row R3a. The third row R3a is on a side opposite to the first row R1a in the second direction D2 with respect to the second row R2a. The third row R3a is along the first direction D1. The plurality of pads 34 are arranged in the fourth row R4a. The fourth row R4a is on a side opposite to the second row R2a in the second direction D2 with respect to the third row R3a. The fourth row R4a is along the first direction D1. The first direction D1 is a direction that is parallel to the board edge 11e, for example. The second direction D2 is a direction from the board edge 11e of the first rigid board 11 to the center part of the first rigid board 11, for example.

The plurality of pads 31 arranged in the first row R1a includes a pad 31A, a pad 31B, a pad 31C, and a pad 31D arranged in this order in the first direction D1.

The plurality of pads 32 arranged in the second row R2a includes a pad 32A, a pad 32B, and a pad 32C arranged in this order in the first direction D1. The position of the pad 32A in the first direction D1 corresponds to a position between the pad 31A and the pad 31B. The position of the pad 32B in the first direction D1 corresponds to a position between the pad 31B and the pad 31C. The position of the pad 32C in the first direction D1 corresponds to a position between the pad 31C and the pad 31D.

The plurality of pads 33 arranged in the third row R3a includes a pad 33A, a pad 33B, a pad 33C, and a pad 33D arranged in this order in the first direction D1. The position of the pad 33A in the first direction D1 corresponds to the position of the pad 31A in the first direction D1. The position of the pad 33B in the first direction D1 corresponds to the position of the pad 31B in the first direction D1. The position of the pad 33C in the first direction D1 corresponds to the position of the pad 31C in the first direction D1. The position of the pad 33D in the first direction D1 corresponds to the position of the pad 31D in the first direction D1. In other words, the position of the pad 33B in the first direction D1 corresponds to a position between the pad 32A and the pad 32B. The position of the pad 33C in the first direction D1 corresponds to a position between the pad 32B and the pad 32C.

The plurality of pads 34 arranged in the fourth row R4a includes a pad 34A, a pad 34B, a pad 34C, and a pad 34D arranged in this order in the first direction D1. The position of the pad 34A in the first direction D1 corresponds to the position of the pad 32A in the first direction D1. The position of the pad 34B in the first direction D1 corresponds to the position of the pad 32B in the first direction D1. The position of the pad 34C in the first direction D1 corresponds to the position of the pad 32C in the first direction D1. The position of the pad 34D in the first direction D1 corresponds to the position of the pad 32D in the first direction D1. In other words, the position of the pad 34A in the first direction D1 corresponds to a position between the pad 33A and the pad 33B. The position of the pad 34B in the first direction D1 corresponds to a position between the pad 33B and the pad 33C. The position of the pad 34C in the first direction D1 corresponds to a position between the pad 33C and the pad 33D.

According to another aspect, the pad 31B, the pad 32A, and the pad 33A are arranged in this order in a third direction D3. The pad 31C, the pad 32B, the pad 33B, and the pad 34B are arranged in this order in the third direction D3. The pad 31D, the pad 32C, the pad 33C, and the pad 34B are arranged in this order in the third direction D3. The third direction D3 is a direction different from the first direction D1 and the second direction D2.

The pad 31A, the pad 32A, the pad 33B, and the pad 34B are arranged in this order in a fourth direction D4. The pad 31B, the pad 32B, the pad 33C, and the pad 34C are arranged in this order in the fourth direction D4. The pad 31C, the pad 32C, and the pad 33D are arranged in this order in the fourth direction D3. The fourth direction D34 is a direction different from the first direction D1, the second direction D2, and the third direction D3.

The connection portion 12a of the second rigid board 12 includes a plurality of pads 30 that are provided on the surface of the second rigid board 12. The layout of the plurality of pads 30 of the second rigid board 12 is the same as the layout of the plurality of pads 30 of the first rigid board 11. Accordingly, description of the pads 30 of the second rigid board 12 is the same as description of the pads 30 of the first rigid board 11, except that the "first rigid board 11" is replaced with the "second rigid board 12," the "board edge 11e" is replaced with the "board edge 12e," the "+X1 direction" is replaced with the "+X2 direction," and the "−X1 direction" is replaced with the "−X2 direction."

Figure 7:
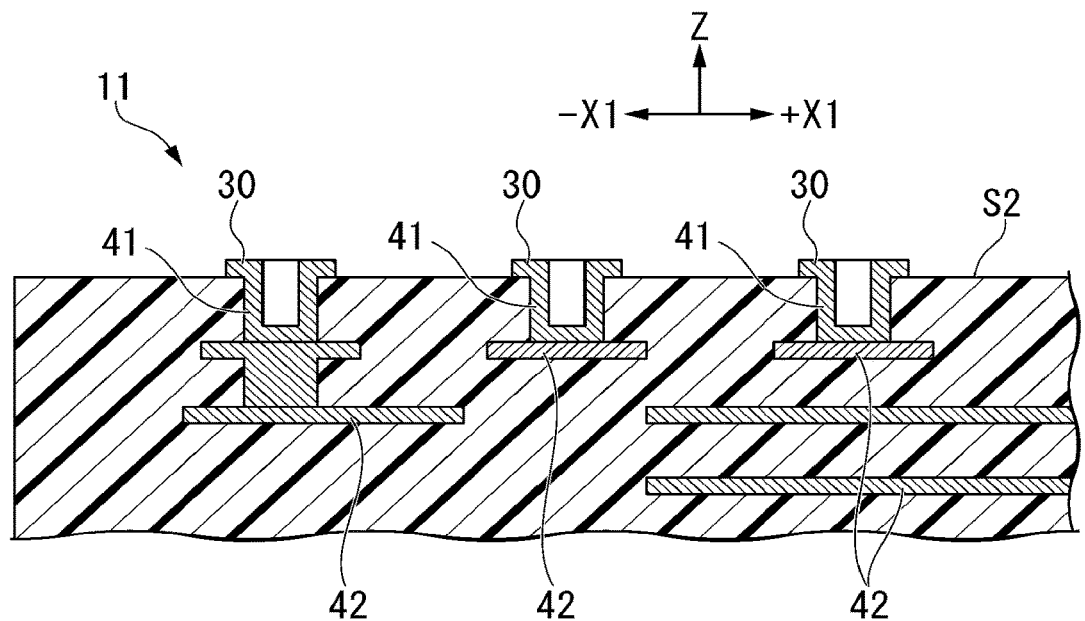
FIG. 7 is a sectional view taken along line F7-F7 of the first rigid board illustrated in FIG. 5.

FIG. 7 is a sectional view taken along line F7-F7 of the first rigid board 11 illustrated in FIG. 5. Each of the plurality of pads 30 is a so-called pad-on-via. That is, the first rigid board 11 includes vias 41 that are connected to the pads 30 in the Z direction. Each pad 30 is formed integrally with the via 41 and is connected to an inner-layer pattern 42 of the first rigid board 11 via the via 41. The via 41 may be a via that has a recessed portion or may be a via which is filled with a conductor. In this embodiment, a wiring pattern that is connected to the pads 30 is not provided on the surface of the first rigid board 11. The pads 30 of the second rigid board 12 are formed in the same way as the pads 30 of the first rigid board 11.

(2.2 Configuration of Flexible Board)

Figure 8:
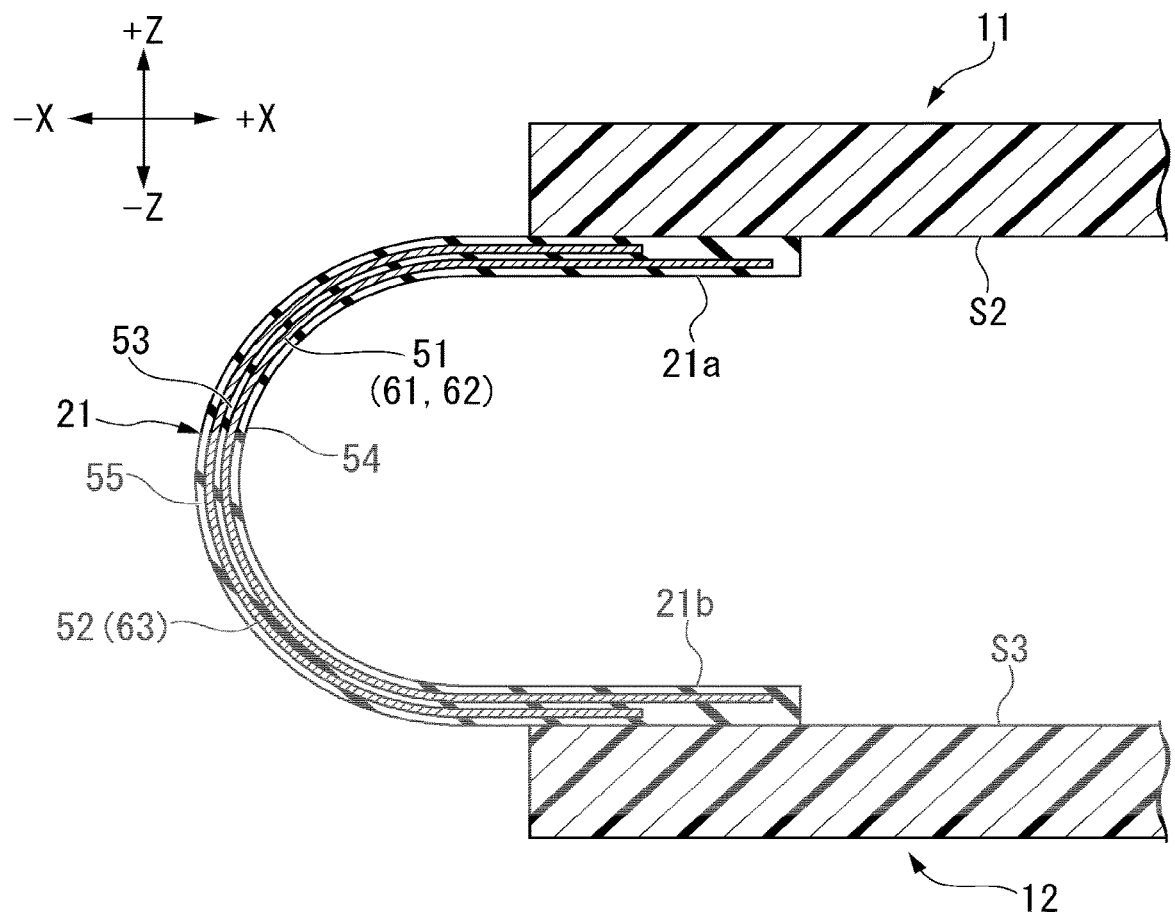
FIG. 8 is a sectional view illustrating the first rigid board, the second rigid board, and the first flexible board in the first embodiment.

FIG. 8 is a sectional view illustrating the first rigid board 11, the second rigid board 12, and the first flexible board 21. In FIG. 8, the fixing structures of the first flexible board 21 to the first and second rigid hoards 11 and 12 are not illustrated.

The first flexible board 21 has a multi-layered structure. The first flexible board 21 includes, for example, a first layer (that is, a first conductive layer) 51, a second layer (that is, a second conductive layer) 52, an intermediate insulating layer 53, a first external insulating layer 54, and a second exterior insulating layer 55.

The intermediate insulating layer 53 is disposed between the first layer 51 and the second layer 52 and insulates the first layer 51 and the second layer 52 from each other. The first external insulating layer 54 is disposed on a side opposite to the intermediate insulating layer 53 with respect to the first layer 51 and covers the first layer 51. The second exterior insulating layer 55 is disposed on a side opposite to the intermediate insulating layer 53 with respect to the second layer 52 and covers the second layer 52. The intermediate insulating layer 53, the first external insulating layer 54, and the second exterior insulating layer 55 are formed of, for example, a light-transmitting insulator (for example, an insulating film or the like). In this embodiment, the intermediate insulating layer 53, the first external insulating layer 54, and the second exterior insulating layer 55 are formed of a transparent member or a colored transparent member and has transparency such that the other side can be seen therethrough.

The first layer 51 includes a plurality of signal lines 61 and a power supply pattern 62 (see FIG. 10) which will be described later. The second layer 52 includes a ground layer 63 (see FIG. 9) which will be described later. In a state in which the first flexible board 21 is bent such that the first rigid board 11 and the second rigid board 12 face each other, the second layer 52 (that is, the ground layer 63) is located closer to the outer side of the first flexible board 21 than the first layer 51 (the plurality of signal lines 61 and the power supply pattern 62). The ground layer 63 is formed in a planar shape and covers at least a part of each of the plurality of signal lines 61 and at least a part of the power supply pattern 62 from the outer side of the first flexible hoard 21.

Figure 9:
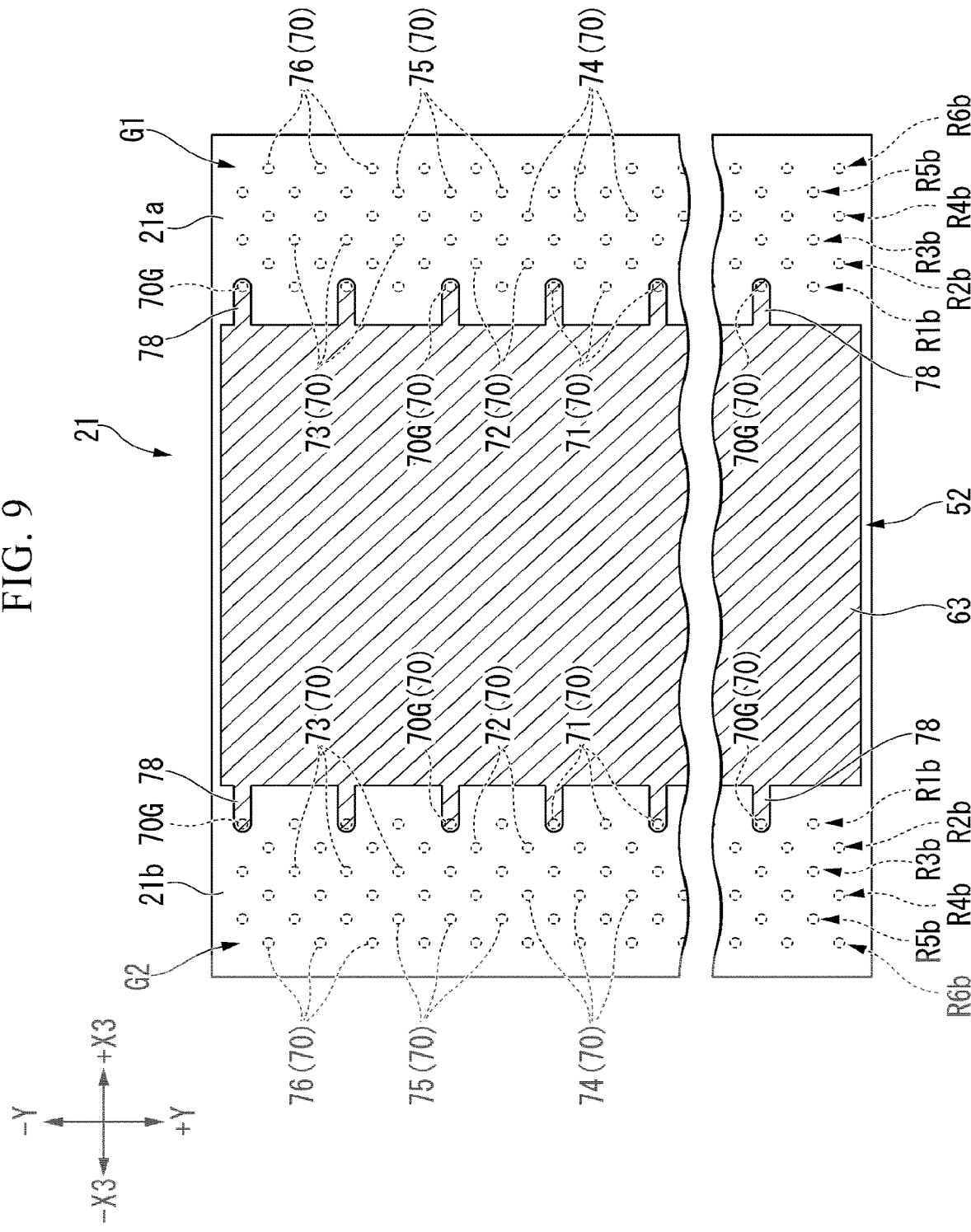
FIG. 9 is a sectional view illustrating a second layer of the first flexible board in the first embodiment.

FIG. 9 is a sectional view illustrating the second layer 52 of the first flexible board 21. In FIG. 9, illustration of vias disposed in the first flexible board 21 and hatching of insulated portions are omitted for the purpose of convenience of description. Here, a +X3 direction and a −X3 direction are defined. The +X3 direction and the −X3 direction are directions which are substantially parallel to the X direction and are directions along the surface of the first flexible board 21 which is stretched flat. The +X3 direction is a direction from the second end portion 21b of the first flexible board 21 to the first end portion 21a. The −X3 direction is a direction which is opposite to the +X3 direction. The +X3 direction and the −X3 direction are simply referred to as an "X3 direction" when the directions are not distinguished.

The first flexible board 21 includes a first pad group G1 and a second pad group G2. The first pad group G1 is disposed in the first end portion 21a of the first flexible board 21. The first pad group G1 includes a plurality of pads 70. Each of the plurality of pads 70 is an example of "terminal". The plurality of pads 70 of the first pad group G1 are arranged to correspond to a plurality of pads 30 of the connection portion 11a of the first rigid board 11 and face the plurality of pads 30 of the first rigid board 11. The layout of the pads 70 of the first pad group G1 is the same as the layout of the pads 30 of the connection portion 11a of the first rigid board 11.

Specifically, the plurality of pads 70 are separately arranged in first to sixth rows (that is, lines) R1b, R2b, R3b, R4b, R5b, and R6b. The first to sixth rows R113, R2b, R3b, R4b, R5b, and R6b are sequentially arranged in this order in the +X3 direction. For example, the first row R1b is disposed closest to the second end portion 21b of the first flexible board 21 among the first to sixth rows R1b, R2b, R3b, R4b, R5b, and R6b. The second row R2b is disposed farther from the second end portion 21b of the first flexible board 21 than the first row R1b. Similarly, the third row R3b, the fourth row R4b, the fifth row R5b, and the sixth row R6b are disposed farther from the second end portion 21b of the first flexible board 21 than the second row R2b, the third row R3b, the fourth row R4b, and the fifth row R5b, respectively.

The plurality of pads 70 include a plurality of pads 71 arranged in the first row R1b, a plurality of second pads 72 arranged in the second row R2b, a plurality of third pads 73 arranged in the third row R3b, a plurality of fourth pads 74 arranged in the fourth row R4b, a plurality of fifth pads 75 arranged in the fifth row R5b, and a plurality of sixth pads 76 arranged in the sixth row R6b. The plurality of first pads 71, the plurality of 72, the plurality of third pads 73, the plurality of fourth pads 74, the plurality of fifth pads 75, and the plurality of sixth pads 76 are arranged with the same intervals therebetween in the Y direction in the corresponding rows. The first to sixth pads 71, 72, 73, 74, 75, and 76 face the first to sixth pads 31, 32, 33, 34, 35, and 36 of the first rigid board 11, respectively. That is, the plurality of the pads 71 are connected to the plurality of the pads 31. The plurality of the pads 72 are connected to the plurality of the pads 32. The plurality of the pads 73 are connected to the plurality of the pads 33. The plurality of the pads 74 are connected to the plurality of the pads 34. The plurality of the pads 75 are connected to the plurality of the pads 35. The plurality of the pads 76 are connected to the plurality of the pads 36.

In this embodiment, each of the plurality of pads 70 of the first pad group G1 is smaller than each of the plurality of pads 30 of the first rigid board 11. The plurality of pads 70 of the first pad group G1 is covered with a light-transmitting insulator (for example, the first external insulating layer 54 or the like) on the side opposite to the side that faces the first rigid board 11. The size of each pad 70 is not limited to the above-mentioned example, and may be equal to the size of each pad 30 or may be larger than that of the pad 30. The insulator of the first flexible hoard 21 may not have transparency.

On the other hand, the second pad group G2 is disposed in the second end portion 21b of the first flexible board 21. The second pad group G2 includes a plurality of pads 70. The plurality of pads 70 of the second pad group G2 are arranged to correspond to the plurality of pads 30 of the connection portion 12a of the second rigid board 12 and face the plurality of pads 30 of the second rigid board 12. The layout of the pads 70 of the second pad group G2 is the same as the layout of the pads 30 of the connection portion 12a of the second rigid board 12. As description of the pads 70 of the second pad group G2 is the same as description of the pads 70 of the first pad group G1, except that the "first pad group G1" can be replaced with the "second pad group G2," the "second end portion 21b" can be replaced with the "first end portion 21a," the "first rigid hoard 11" can be replaced with the "second rigid hoard 12," the "+X3 direction" can be replaced with the "−X3 direction," and the "−X3 direction" can be replaced with the "+X3 direction."

In this embodiment, each of the plurality of pads 70 of the second pad group G2 is smaller than each of the plurality of pads 30 of the second rigid board 12. The plurality of pads 70 of the second pad group G2 is covered with a light-transmitting insulator (for example, the first external insulating layer 54 or the like) on the side opposite to the side that faces the second rigid board 12. The size of each pad 70 is not limited to the above-mentioned example, and may be equal to the size of each pad 30 or may be larger than that of the pad 30. As described above, the insulator of the first flexible board 21 may not have transparency.

Here, each of the first pad group G1 and the second pad group G2 includes a plurality of signal pads 70S (see FIG. 10), a plurality of power supply pads 70P (see FIG. 10), and a plurality of ground pads 70G. The signal pads 70S are pads which are connected to the signal lines 61. In this embodiment, the signal pads 70S are disposed in the first to sixth rows R1*b*, R2*b*, R3*b*, R4*b*, R5*b*, and R6*b* in each of the first pad group G1 and the second pad group G2. The power supply pads 70P are pads which are connected to the power supply pattern 62. In this embodiment, the power supply pads 70P are disposed in the second to sixth rows R2*b*, R3*b*, R4*b*, R5*b*, and R6*b* in each of the first pad group G1 and the second pad group G2. The ground pads 70G are pads which are connected to the ground layer 63. In this embodiment, the ground pads 70G are disposed in the first row R1*b* in each of the first pad group G1 and the second pad group G2. For example, in the first row R1*b*, the ground pads 70G and the signal pads 70S are alternately arranged in the Y direction.

The ground layer 63 is disposed between the first pad group G1 and the second pad group G2 and extends in a planar shape parallel to the X3 direction and the Y direction. The ground layer 63 is connected to the plurality of ground pads 70G of the first pad group G1 and the plurality of ground pads 70G of the second pad group G2 by a plurality of ground connection lines 78 that is included in the second layer 52. The ground connection lines 78 have a larger width in the Y direction than that of the signal lines 61.

Figure 10:
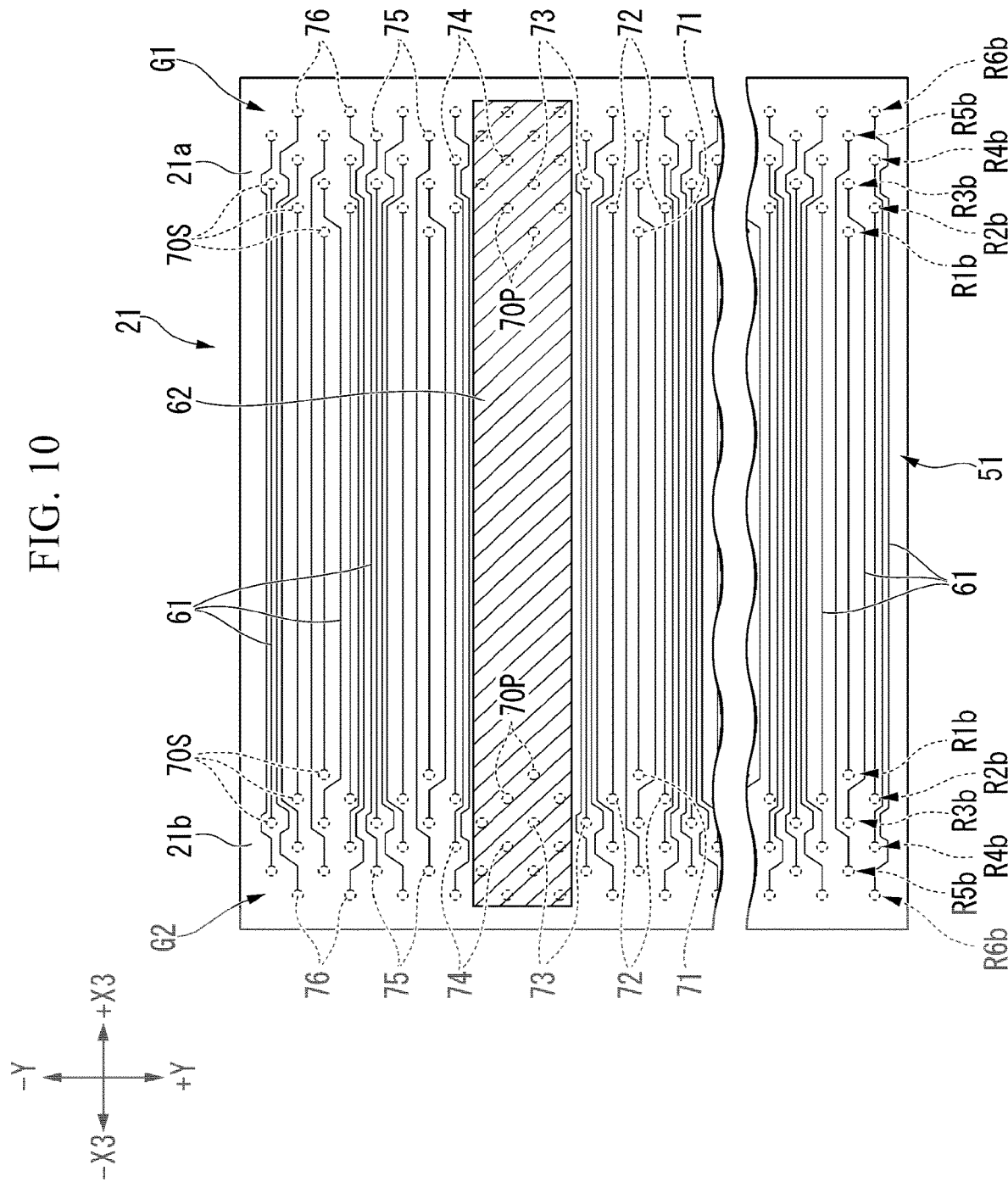
FIG. 10 is a sectional view illustrating a first layer of the first flexible board in the first embodiment.

FIG. 10 is a sectional view illustrating the first layer 51 of the first flexible board 21. In FIG. 10, illustration of vias disposed in the first flexible board 21 and hatching of insulated portions are omitted for the purpose of convenience of description.

The plurality of signal lines 61 extend between the first pad group G1 and the second pad group G2. The plurality of signal lines 61 connect the plurality of signal pads 70S included in the first pad group G1 and the plurality of signal pads 70S included in the second pad group G2, for example, in one-to-one correspondence manner.

The power supply pattern 62 extends between the first pad group G1 and the second pad group G2. The power supply pattern 62 connects the plurality of power supply pads 70P included in the first pad group G1 and the plurality of power supply pads 70P included in the second pad group G2.

Figure 11:
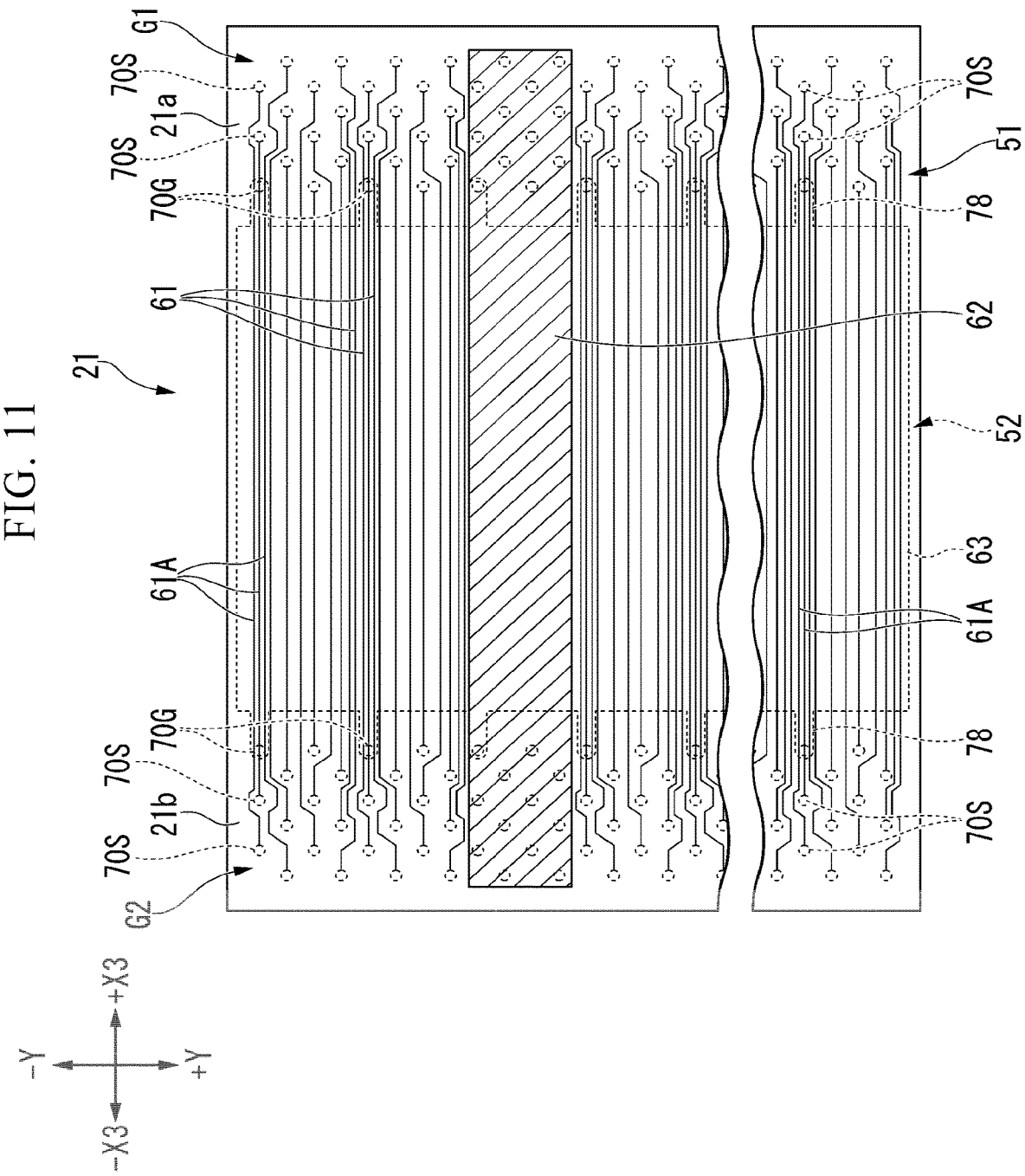
FIG. 11 is a sectional view illustrating a superimposed state of the first layer and the second layer of the first flexible board in the first embodiment.

FIG. 11 is a sectional view illustrating a superimposed state of the first layer 51 and the second layer 52 of the first flexible board 21. The plurality of signal lines 61 include a plurality of signal lines 61A that are connected to the signal pads 70S disposed in one of the second to sixth rows R2*b*, R3*b*, R4*b*, R5*b*, and R6*b* in the first pad group G1 or the second pad group G2. One or more (for example, two or more) signal lines 61A included in the plurality of signal lines 61A extend in the X3 direction through positions overlapping the ground pads 70G in the thickness direction of the first flexible board 21. In this embodiment, one or more (for example, two or more) signal lines 61A extend in the X3 direction through an area overlapping the ground connection lines 78 in the thickness direction of the first flexible board 21.

(2.3 Configuration of Solder Portion)

Figure 12:
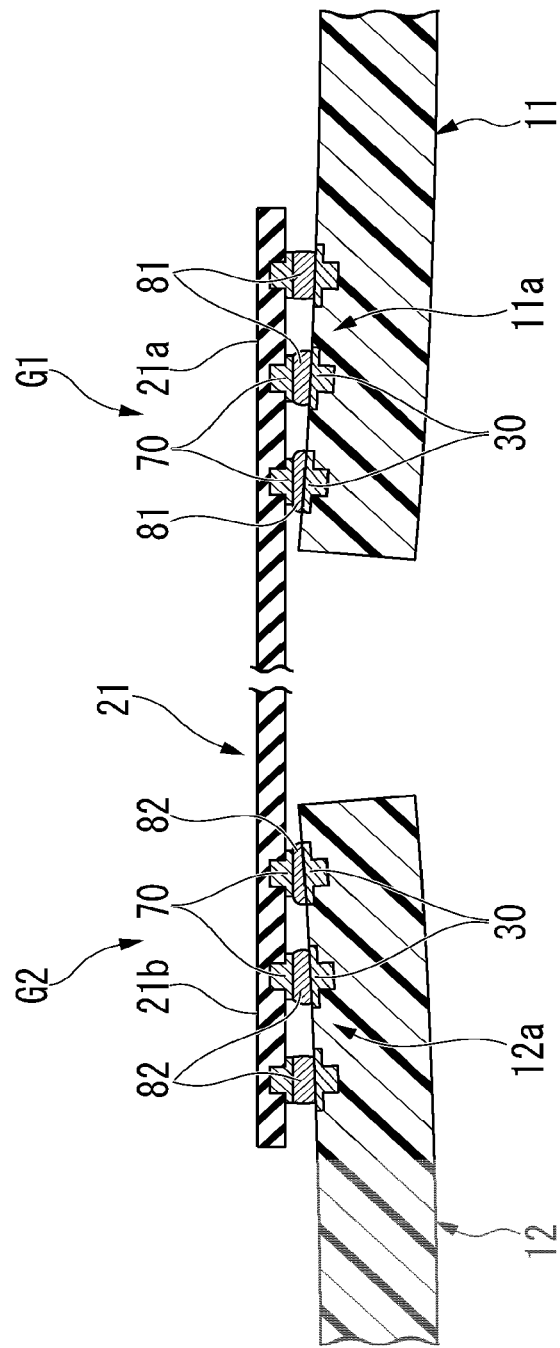
FIG. 12 is a sectional view taken along line F12-F12 of the first rigid board, the second rigid board, and the first flexible board which are illustrated in FIG. 4.

FIG. 12 is a sectional view taken along line F12-F12 of the first rigid board 11, the second rigid board 12, and the first flexible board 21 illustrated in FIG. 4. The first end portion 21*a* of the first flexible board 21 is fixed to the connection portion 11*a* of the first rigid board 11 by a plurality of first solder portions 81. That is, the first solder portions 81 are disposed between the pads 70 of the first end portion 21*a* of the first flexible board 21 and the pads 30 of the connection portion 11*a* of the first rigid board 11 and bond the pads 70 of the first flexible board 21 to the pads 30 of the first rigid board 11. The first solder portions 81 are, for example, solder balls or solder pastes.

Similarly, the second end portion 21*b* of the first flexible board 21 is fixed to the second rigid board 12 by a plurality of second solder portions 82. That is, the second solder portions 82 are disposed between the pads 70 of the second end portion 21*b* of the first flexible board 21 and the pads 30 of the connection portion 12*a* of the second rigid board 12 and bond the pads 70 of the first flexible board 21 to the pads 30 of the second rigid board 12. The second solder portions 82 are, for example, solder balls or solder pastes.

In this embodiment, the first solder portions 81 and the second solder portions 82 are solder balls. In this specification, the term "solder ball" is not limited to a case where the solder ball is spherical but includes a case where the solder ball is collapsed. Here, one or more of the first rigid board 11, second rigid board 12, and the first flexible board 21 may warp, for example, due to thermal expansion at the time of reflow or other reasons.

The first solder portions 81 have a height which can enable absorption of maximum warpage which is expected in the first rigid board 11 and the first flexible board 21. The plurality of first solder portions 81 absorb warpage of the first rigid board 11 and the first flexible board 21 by deforming (for example, growing or collapsing) to follow the size of the gap between the first rigid board 11 and the first flexible board 21 at positions thereof.

Similarly, the second solder portions 82 have a height which can enable absorption of maximum warpage which is expected in the second rigid board 12 and the first flexible board 21. The plurality of second solder portions 82 absorb warpage of the second rigid board 12 and the first flexible board 21 by deforming (for example, growing or collapsing) to follow the size of the gap between the second rigid board 12 and the first flexible board 21 at positions thereof.

The fixing structure between the first rigid board 11 and the first flexible board 21 and the fixing structure between the second rigid board 12 and the first flexible board 21 have been described above. The fixing structure between the first rigid board 11 and the second flexible board 22 and the fixing structure between the third rigid board 13 and the second flexible board 22 have the same configurations as those described above. That is, each of the connection portion 11*b* of the first rigid board 11 and the connection portion 13*a* of the third rigid board 13 includes a plurality of pads 30. Each of a first end portion 22*a* and a second end portion 22*b* of the second flexible substrate 22 includes a plurality of pads 70. The plurality of pads 30 of the connection portion 11*b* of the first rigid board 11 and the plurality of pads 70 of the first end portion 22*a* of the second flexible board 22 are connected by a plurality of first solder portions 81. The plurality of pads 30 of the connection portion 13*a* of the third rigid board 13 and the plurality of pads 70 of the second end portion 22*b* of the second flexible board 22 are connected by a plurality of second solder portions 82.

(3. Configuration of Spacer)

The first and second spacers 17 and 18 will be described below with reference back to FIG. 2. The first and second spacers 17 and 18 are formed, for example, in a frame shape. The first spacer 17 is disposed between the first rigid board 11 and the second rigid board 12 and is interposed between the first end portion 21*a* of the first flexible board 21 and the second end portion 21*b* of the first flexible board 21. The first spacer 17 is also interposed between the first end portion 22*a* of the second flexible board 22 and the second rigid board 12.

The first spacer 17 faces the first end portion 21*a* of the first flexible board 21 from the side opposite to the first rigid board 11 and supports the first end portion 21a of the first flexible board 21. The first spacer 17 faces the second end portion 21b of the first flexible board 21 from the side opposite to the second rigid board 12 and supports the second end portion 21b of the first flexible board 21. The first spacer 17 faces the first end portion 22a of the second flexible hoard 22 from the side opposite to the first rigid board 11 and supports the first end portion 22a of the second flexible board 22.

On the other hand, the second spacer 18 is disposed between the second rigid board 12 and the third rigid board 13 and is interposed between the second rigid board 12 and the second end portion 21b of the first flexible board 21. The second spacer 18 faces the second end portion 21b of the first flexible board 21 from the side opposite to the third rigid board 13 and supports the second end portion 21b of the first flexible board 21.

Figure 13:
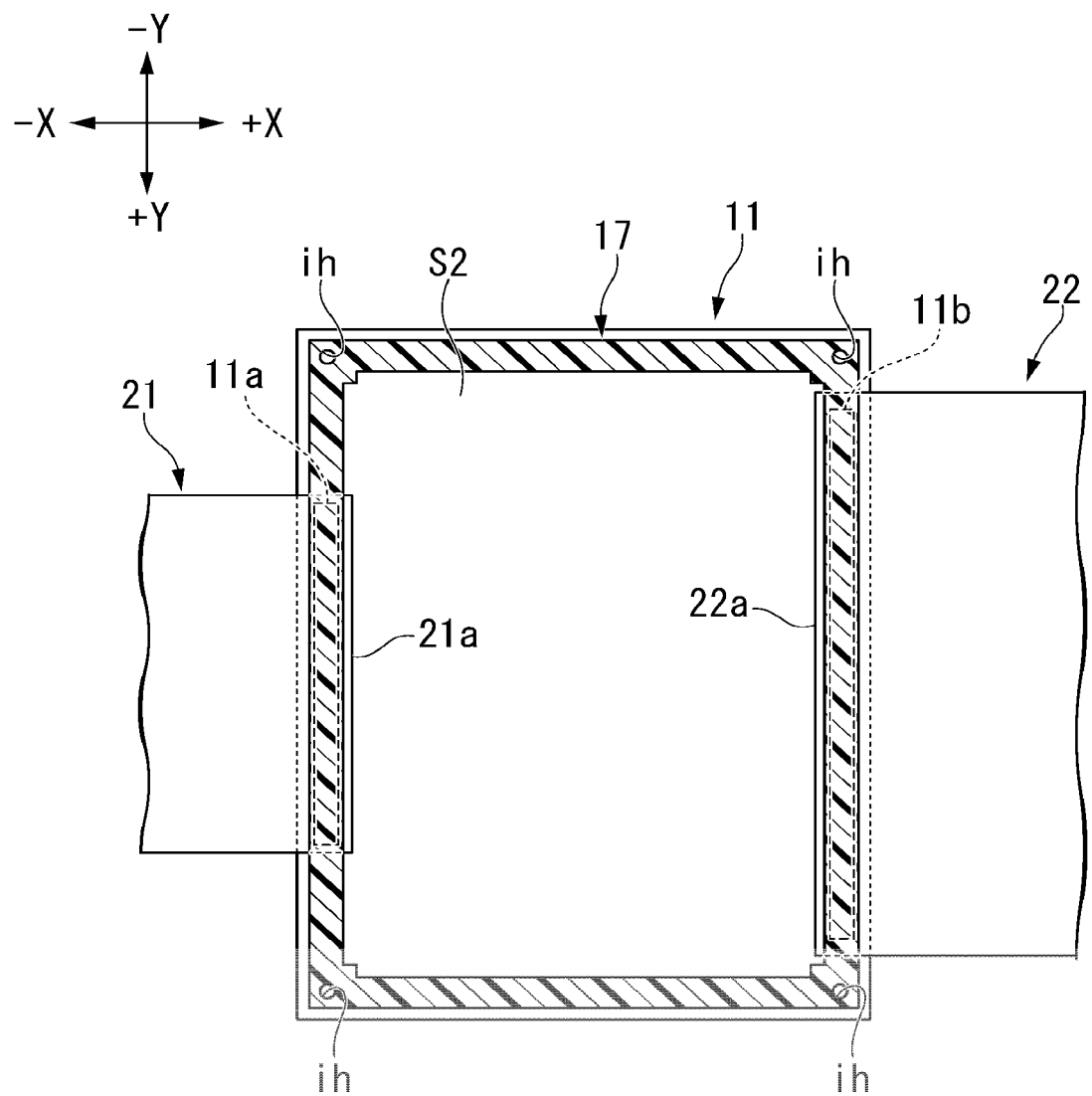
FIG. 13 is a sectional view taken along line F13-F13 of a partial configuration of the semiconductor storage device illustrated in FIG. 2.

FIG. 13 is a sectional view taken along line F13-F13 of a partial configuration of the semiconductor storage device 1 illustrated in FIG. 2. In FIG. 13, the first and second flexible boards 21 and 22 are illustrated in a state in which both boards are stretched flat.

In this embodiment, the first spacer 17 faces the pads 30 of the first to sixth rows R1a, R2a, R3a, R4a, R5a, and R6a of the connection portion 11a of the first rigid hoard 11 in the Z direction. That is, the first spacer 17 covers the plurality of first solder portions 81 bonded to the first end portion 21a of the first flexible board 21 from the side opposite to the first rigid board 11. The first spacer 17 supports the first end portion 21a of the first flexible board 21 such that the first end portion 21a of the first flexible board 21 is not separated from the plurality of first solder portions 81 (is not separated from the connection portion 11a of the first rigid board 11).

Similarly, the first spacer 17 faces the pads 30 of the first to sixth rows R1a, R2a, R3a, R4a, R5a, and R6a of the connection portion 11b of the first rigid board 11 in the Z direction. That is, the first spacer 17 covers the plurality of first solder portions 81 bonded to the first end portion 22a of the second flexible board 22 from the side opposite to the first rigid board 11. The first spacer 17 supports the first end portion 22a of the second flexible board 22 such that the first end portion 22a of the second flexible board 22 is not separated from the first solder portions 81 (that is, is not separated from the connection portion 11b of the first rigid board 11).

Although not illustrated, the first spacer 17 faces the pads 30 of the first to sixth rows R1a, R2a, R3a, R4a, R5a, and R6a of the connection portion 12a of the second rigid board 12 in the Z direction. That is, the first spacer 17 covers the plurality of second solder portions 82 bonded to the second end portion 21b of the first flexible board 21 from the side opposite to the second rigid board 12. The first spacer 17 supports the second end portion 21b of the first flexible board 21 such that the second end portion 21b of the first flexible board 21 is not separated from the second solder portions 82 (that is, is not separated from the connection portion 12a of the second rigid board 12).

Similarly, the second spacer 18 faces the pads 30 of the first to sixth rows R1a, R2a, R3a, R4a, R5a, and R6a of the connection portion 13a of the third rigid board 13 in the Z direction. That is, the second spacer 18 covers the plurality of second solder portions 82 bonded to the second end portion 22b of the second flexible board 22 from the side opposite to the third rigid board 13. The second spacer 18 supports the second end portion 22b of the second flexible board 22 such that the second end portion 22b of the second flexible board 22 is not separated from the second solder portions 82 (that is, is not separated from the connection portion 13a of the third rigid board 13).

According to this configuration, it is possible to provide a semiconductor storage device that can achieve an increase in capacity and improvement in repairability, for example, in comparison with a case in which an anisotropic conductive film (ACF) is used. That is, the semiconductor storage device 1 includes the first flexible board 21 that connects the first rigid board 11 and the second rigid board 12. The first flexible board 21 includes the first end portion 21a that is fixed to the surface of the first rigid board 11 and the second end portion 21b that is fixed to the surface of the second rigid board 12 and is disposed in the housing 10 in a state in which at least a part thereof is bent. According to this configuration, for example, in comparison with a case in which a so-called board-to-board (B-to-B) connector is used, it is possible to arrange a plurality of rigid boards with a higher density and to increase the number of boards which are accommodated in the housing 10. When the number of boards which can be accommodated in the housing 10 can increase, it is possible to mount of more semiconductor memory components and to achieve an increase in memory capacity.

On the other hand, in a case where the first flexible board 21 is fixed to the surfaces of the first and second rigid boards 11 and 12, the first and second rigid boards 11 and 12 can be separated from each other by detaching the first flexible board 21 from at least one of the first and second rigid boards 11 and 12. Accordingly, for example, in a case where a defect occurs in one of the first and second rigid boards 11 and 12, the corresponding hoard can be detached and replaced or repaired. Accordingly, it is possible to improve repairability of the semiconductor storage device 1, for example, in comparison with a case in which an ACF is used. "Repairability" mentioned in this specification widely refers to easiness of replacement or repair of a component.

In this embodiment, the first end portion 21a of the first flexible board 21 is fixed to the first rigid board 11 by a plurality of first solder portions 81. According to this configuration, the first flexible board 21 can be easily detached from the first rigid board 11 by melting the first solder portions 81. Accordingly, it is possible to further improve repairability of the semiconductor storage device 1.

In this embodiment, the semiconductor storage device 1 further includes the third rigid board 13 and the second flexible board 22. The second flexible board 22 includes the first end portion 22a that is fixed to the surface of the first rigid board 11 and the second end portion 22b that is fixed to the surface of the third rigid board 13 and is disposed in the housing 10 in a state in which at least a part thereof is bent. According to this configuration, since the first rigid board 11 serving as, for example, a mother board and the third rigid board 13 serving as, for example, a second child board can be directly connected by the second flexible board 22, it is possible to reduce a wiring length of a signal, for example, in comparison with a case in which the first rigid board 11 and the third rigid board 13 are connected via the second rigid board 12. Accordingly, it is possible to further improve performance (for example, signal quality) of the semiconductor storage device 1.

In this embodiment, the first rigid board 11 includes the second principal surface S2 that faces the second rigid board 12. The first end portion 21a of the first flexible board 21 is fixed to the second principal surface S2 of the first rigid board 11. According to this configuration, even when the first flexible board 21 has elasticity, it is possible to curb departure of the first end portion 21a of the first flexible board 21 from the first rigid board 11 due to the elasticity.

In this embodiment, the semiconductor storage device 1 includes the first spacer 17 that is disposed between the first rigid board 11 and the second rigid board 12 and faces the first end portion 21a of the first flexible board 21 from the side opposite to the first rigid board 11. According to this configuration, since the first end portion 21a of the first flexible board 21 can be supported by the first spacer 17, it is possible to more satisfactorily curb departure of the first end portion 21a of the first flexible board 21 from the first rigid board 11.

In this embodiment, the first flexible board 21 includes a plurality of signal lines 61 and a planar ground layer 63 that is disposed closer to the outer side of the first flexible board 21 than the plurality of signal lines 61 in a state in which the first flexible board 21 is bent and covers at least a part of each of the plurality of signal lines 61. According to this configuration, it is possible to reduce an influence of external electromagnetic interference (EMI) on the signal lines 61. In a case where the ground layer 63 is disposed behind the plurality of signal lines 61, it is possible to facilitate calculation of impedance of the signal lines 61 in a case in which high-frequency signals are handled.

In this embodiment, the first end portion 21a of the first flexible board 21 is fixed to the first rigid board 11 by a plurality of first solder portions 81 which are solder balls. According to this configuration, it is possible to easily absorb warpage of the first rigid board 11 and the first flexible board 21 using the first solder portions 81 and to curb occurrence of an open defect between the first rigid board 11 and the first flexible board 21.

In this embodiment, the plurality of pads 30 include a plurality of pads 31 that are arranged in the first row R1a and a plurality of 32 that are arranged in the second row R2a which is separated farther from the board edge 11e than the first row R1a. According to this configuration, even when a size of a board (for example, a length of a board end) is predetermined, it is possible to increase the number of lines that connect the first rigid board 11 and the second rigid board 12.

In this embodiment, the plurality of pads 32 are arranged at positions which are shifted from the plurality of pads 31 in the direction in which the plurality of pads 31 are arranged. According to this configuration, it is possible to secure a relatively large gap between the plurality of pads 30. Accordingly, it is possible to curb formation of a solder bridge between the plurality of pads 30.

In this embodiment, the first flexible board 21 includes a plurality of pads 70 that face the pads 30 of the first rigid board 11 and a light-transmitting insulator that covers the plurality of pads 70. Each of the plurality of pads 70 of the first flexible board 21 is smaller than each of the plurality of pads 30 of the first rigid board 11. According to this configuration, bonding failure can be visually checked from above the first flexible board 21 after the first end portion 21a of the first flexible board 21 has been bonded to the first rigid board 11. Accordingly, it is possible to enhance manufacturability of the semiconductor storage device 1.

In this embodiment, at least one signal line 61A included in the plurality of signal lines 61 extends through a position which is superimposed on the ground pad 70G in the thickness direction of the first flexible board 21. Here, the ground layer 63 is connected to the plurality of ground pads 70G via a plurality of ground connection lines 78. Accordingly, even when one ground pad 70G has bonding failure, the influence thereof as a whole is restrictive. On the other hand, when bonding failure occurs in a signal pad 70S, the influence is relatively great. Therefore, in this embodiment, some signal lines 61 are disposed at positions which are superimposed on the ground pads 70G. According to this configuration, it is possible to increase a degree of freedom in layout of the signal lines 61. As a result, bonding failure of the signal pads 70S can be more easily checked visually from above the first flexible board 21.

Second Embodiment

A second embodiment will be described below. The second embodiment is different from the first embodiment, in that the size of the pads 31 disposed in the first row R1a is larger than the size of the pads 32 disposed in the second row R2a. The other configuration which will be described below is the same as the configuration in the first embodiment.

Figure 14:
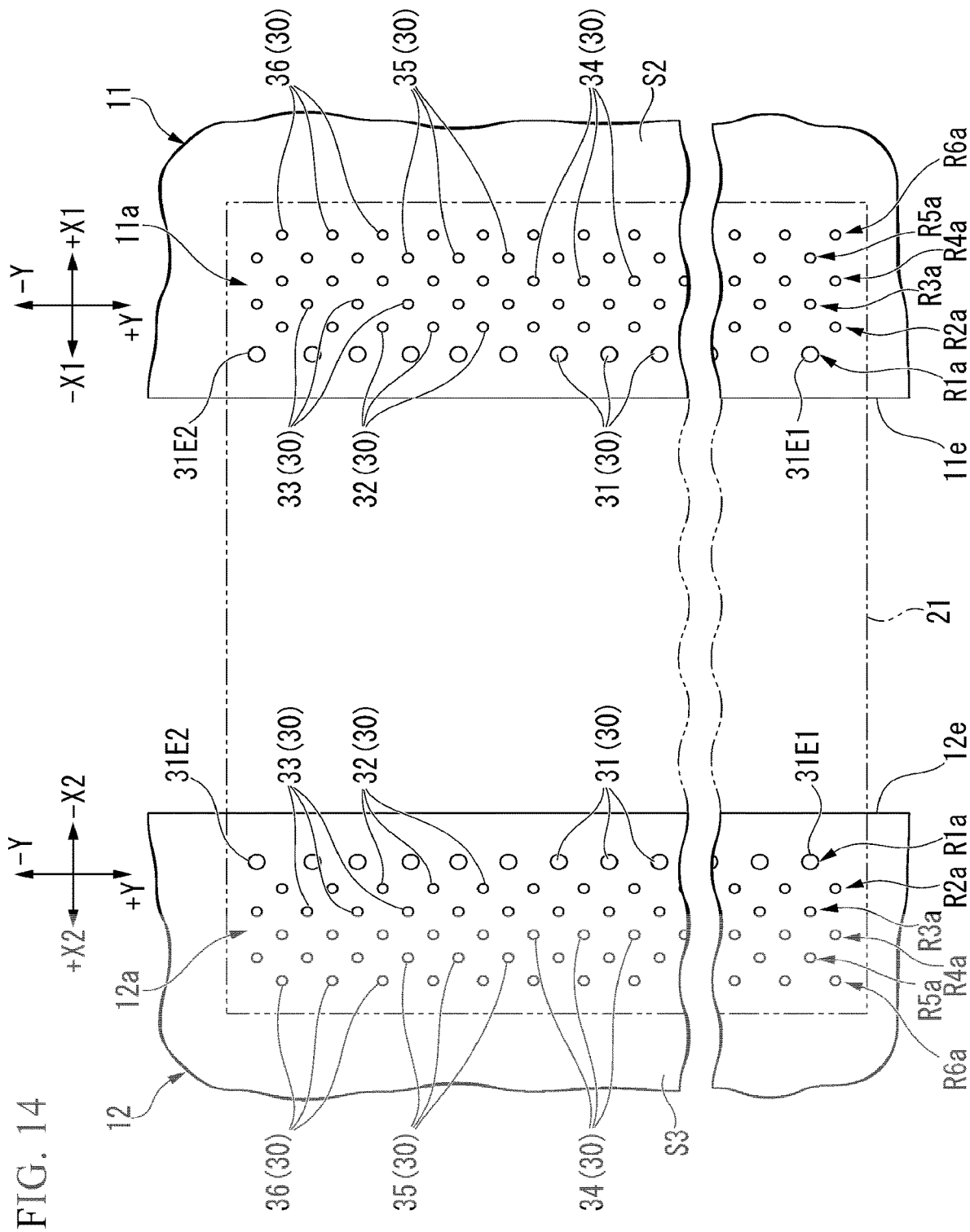
FIG. 14 is an enlarged plan view illustrating a connection portion between a first rigid board and a second rigid board in a second embodiment.

FIG. 14 is an enlarged plan view illustrating connection portions 11a and 12a of the first rigid board 11 and the second rigid board 12 in the second embodiment. In this embodiment, the pads 31 are larger than the pads 32. Solder portions 81 and 82 (for example, solder halls) which are bonded to the pads 31 are larger than solder portions (for example, solder balls) which are bonded to the pads 32. In the first flexible board 21, the pads 71 may be larger than the pads 72.

According to this configuration, it is possible to more satisfactorily curb occurrence of a failure in the semiconductor storage device 1. That is, a large load due to an external force is likely to act on the pads 31 located in the first row R1a among the pads 30 of the first to sixth rows R1a, R2a, R1a, R4a, R5a, and R6a and the solder portions 81 disposed on the pads 31. Therefore, in this embodiment, the pads 31 arc formed to be larger than the pads 32. Accordingly, bonding strength between the pads 31 and the solder portions 81 and 82 disposed on the pads 31 is set to be larger than that of the pads 32, 33, 34, 35, and 36 disposed in other rows. Accordingly, it is possible to more satisfactorily curb occurrence of an open defect in the pads 31.

In this embodiment, all of the plurality of pads 31 disposed in the first row R1a are larger than the pads 32. Instead, only two pads 31E1 and 31E2 which are disposed at both ends on the +Y side and the −Y side among the plurality of pads 31 may be set to be larger than the pads 32.

Third Embodiment

A third embodiment will be described below. The third embodiment is different from the second embodiment, in that some pads 30 of the pads 32, 33, 34, 35, and 36 are formed larger than the other pads 30. The other configuration which will be described below is the same as the configuration in the second embodiment.

Figure 15:
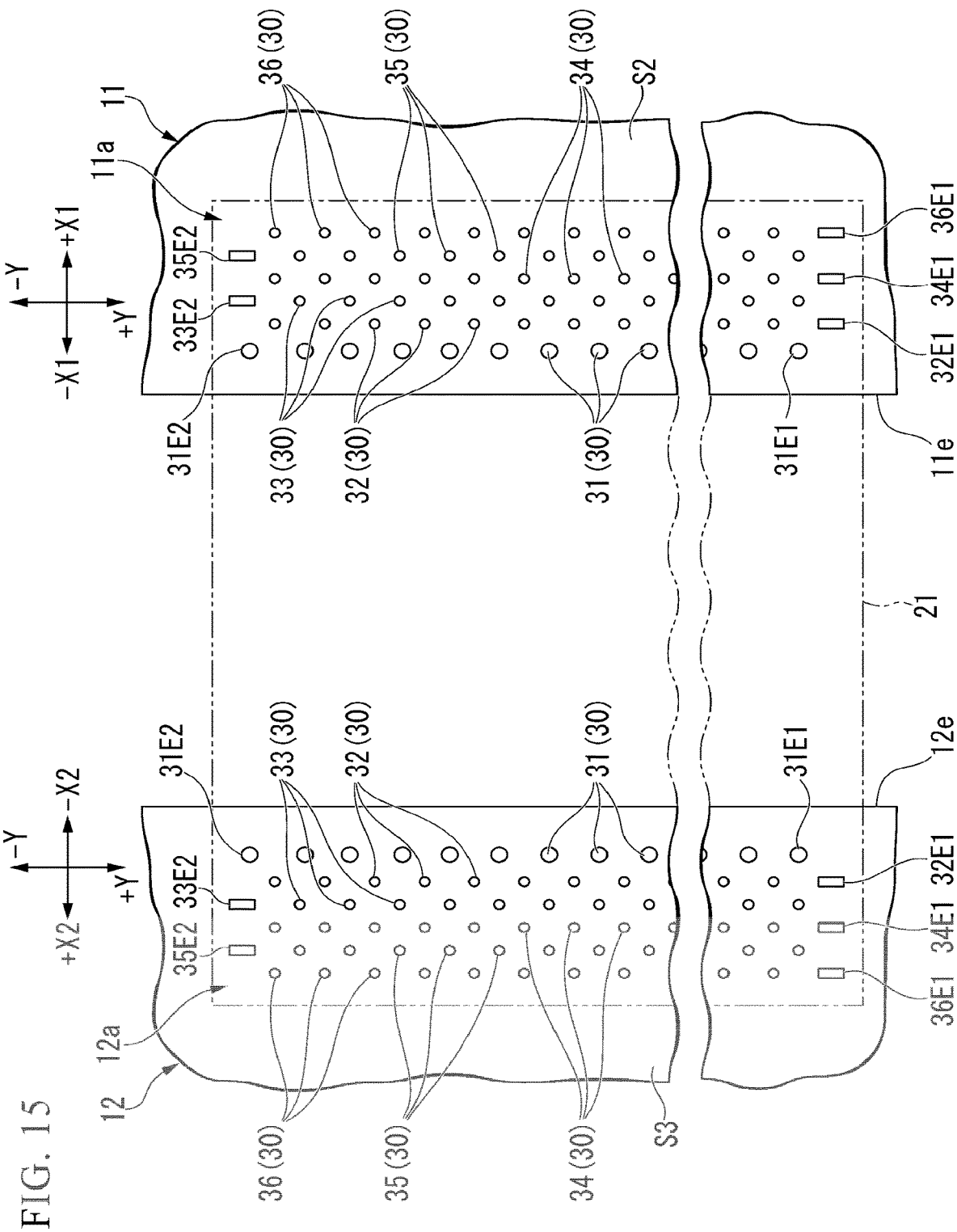
FIG. 15 is an enlarged plan view illustrating a connection portion between a first rigid board and a second rigid board in a third embodiment.

FIG. 15 is an enlarged plan view illustrating the connection portions 11a and 12a of the first rigid board 11 and the second rigid board 12 in the third embodiment. In this embodiment, the second to sixth pads 32, 33, 34, 35, and 36 include a plurality of pads 32E1, 34E1, and 36E1 which are located closest to the +Y side and a plurality of pads 33E2 and 35E2 which are located closest to the −Y side among the second to sixth pads 32, 33, 34, 35, and 36. The pads 32E1, 34E1, and 36E1 are formed in a rectangular shape or an elliptical shape which is long in the direction (the +Y direction) in which they are separated away from the near pads 32, 34, and 36 included in the same rows and has a larger area than that of the neighboring pads 32, 34, and 36 included in the same rows. Similarly, the pads 33E2 and 35E2 are formed in a rectangular shape or an elliptical shape which is long in the direction (the −Y direction) in which they are separated away from the neighboring pads 33 and 35 included in the same rows and has a larger area than that of the neighboring pads 33 and 35 included in the same rows.

According to this configuration, by forming the pads 32E1, 34E1, 36E1, 33E2, and 35E2 on which a load due to an external force is likely to act to be larger, the bonding strength between the pads 32E1, 34E1, 36E1, 33E2, and 35E2 and the solder portions 81 and 82 which are disposed in the pads 32E1, 34E1, 36E1, 33E2, and 35E2 is set to be greater than the bonding strength for the other pads 32, 33, 34, 35, and 36 disposed in the same row. Accordingly, it is possible to more satisfactorily curb occurrence of an open defect in the pads 32E1, 34E1, 36E1, 33E2, and 35E2.

Fourth Embodiment

A fourth embodiment will be described below. The fourth embodiment is different from the first embodiment, in that the shape of the first spacer 17 is different from the shape of the first spacer 17 in the first embodiment. The other configuration which will be described below is the same as the configuration in the first embodiment.

Figure 16:
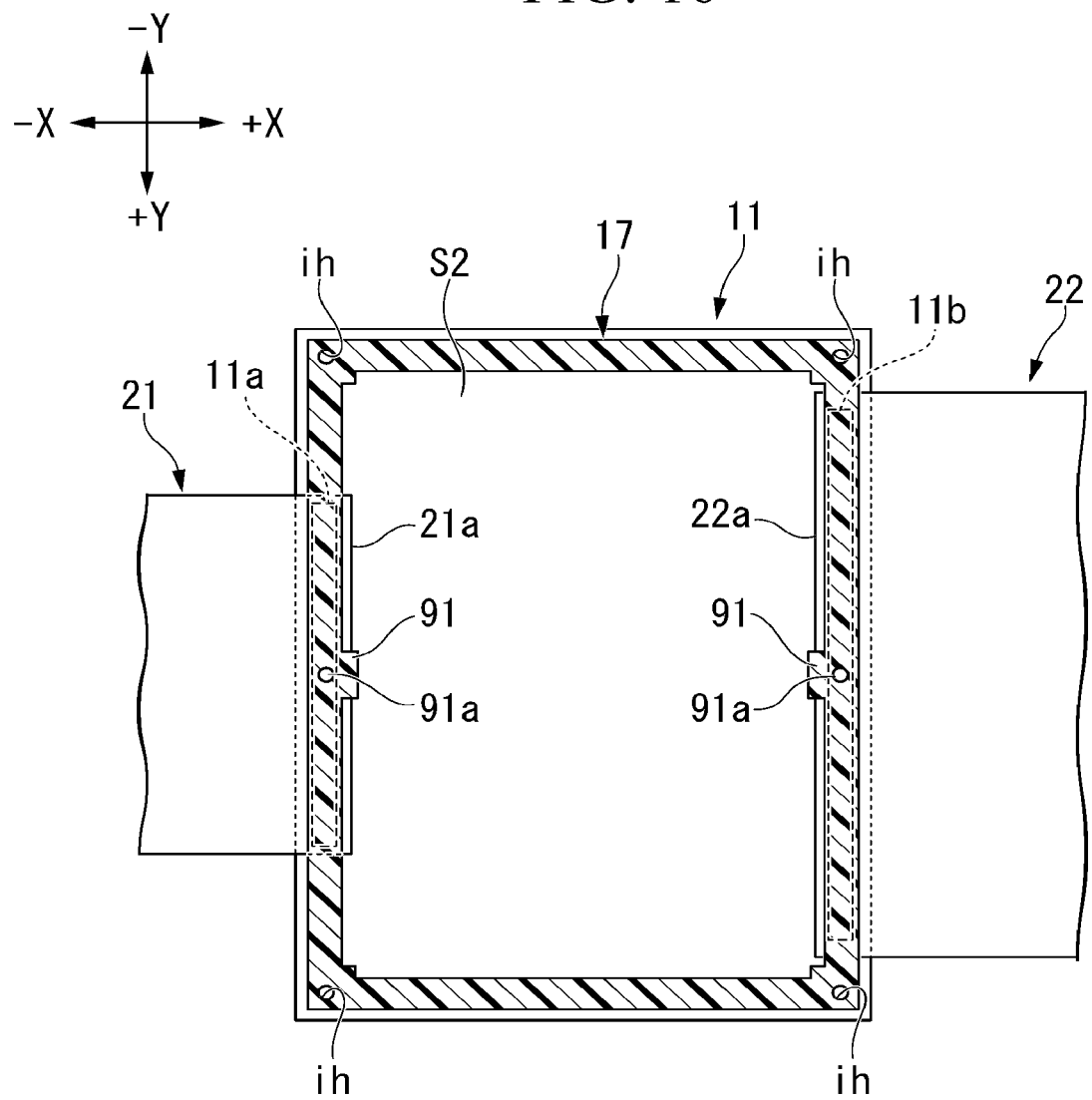
FIG. 16 is a sectional view illustrating a partial configuration of a semiconductor storage device according to a fourth embodiment.

FIG. 16 is a sectional view illustrating a partial configuration of a semiconductor storage device 1 according to the fourth embodiment. In this embodiment, the first spacer 17 includes pressing portions 91 that face the first end portion 21a of the first flexible board 21 and the first end portion 22a of the second flexible board 22 in the Z direction. Each pressing portion 91 includes a hole 91a through which a fixing member 25 passes. For example, the fixing member 25 is inserted into the hole 91a and is fixed to the housing 10 or the rigid board (for example, the first rigid board 11 or the second rigid board 12). As a result, the pressing portions 91 press the first end portion 21a of the first flexible board 21 and the first end portion 22a of the second flexible board 22 to the first rigid board 11.

According to this configuration, it is possible to more satisfactorily curb the first end portion 21a of the first flexible board 21 and the first end portion 22a of the second flexible board 22 from departing from the first rigid board 11.

Fifth Embodiment

A fifth embodiment will be described below. The fifth embodiment is different from the first embodiment, in that the shape of the first spacer 17 is different from the shape of the first spacer 17 in the first embodiment. The other configuration which will be described below is the same as the configuration in the first embodiment.

Figure 17:
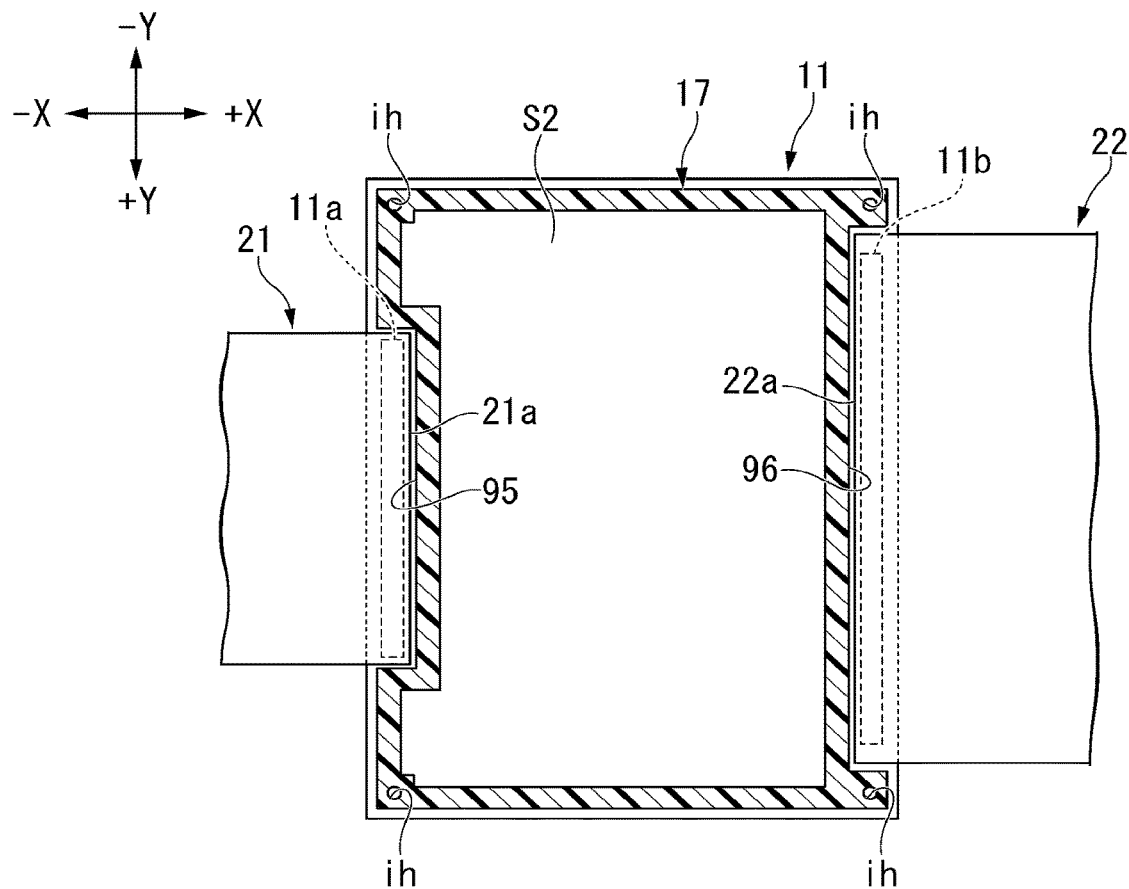
FIG. 17 is a sectional view illustrating a partial configuration of a semiconductor storage device according to a fifth embodiment.

FIG. 17 is a sectional view illustrating a partial configuration of a semiconductor storage device 1 according to the fifth embodiment. In this embodiment, the first spacer 17 includes a first recessed portion 95 that avoids the first end portion 21a of the first flexible board 21 and a second recessed portion 96 that avoids the first end portion 22a of the second flexible board 22. The first spacer 17 dose not overlap the first end portion 21a of the first flexible board 21 and the first end portion 22a of the second flexible board 22 in the Z direction. The first spacer 17 is interposed between the first rigid board 11 and the second rigid board 12.

Although not illustrated, the second spacer 18 includes a recessed portion that avoids the second end portion 22b of the second flexible board 22 and dose not overlap the second end portion 22b of the second flexible board 22 in the Z direction. The second spacer 18 is interposed between the second rigid hoard 12 and the third rigid board 13.

According to this configuration, when resistance of the bonding portions between the flexible boards 21 and 22 and the rigid boards 11, 12, and 13 to an external force is not large, it is possible to curb a large external force from being applied to the bonding portions between the flexible boards 21 and 22 and the rigid boards 11, 12, and 13.

Sixth Embodiment

A sixth embodiment will be described below. The sixth embodiment is different from the first embodiment, in that a plurality of flexible boards 101 and 102 are disposed between a pair of rigid boards 11 and 12. The other configuration which will be described below is the same as the configuration in the first embodiment.

Figure 18:
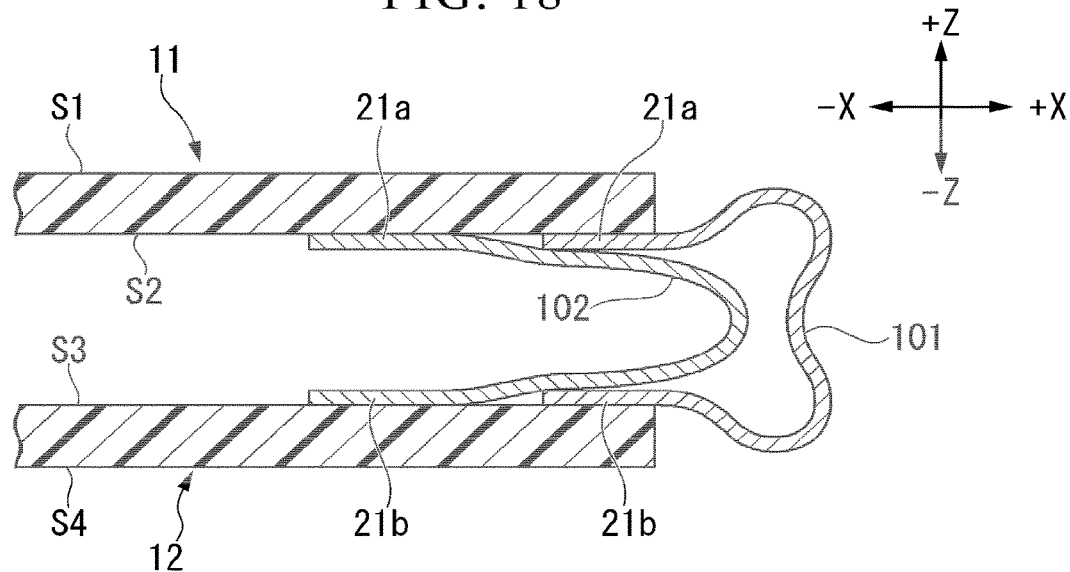
FIG. 18 is a sectional view illustrating a first rigid board, a second rigid board, and a plurality of flexible boards in a sixth embodiment.

FIG. 18 is a sectional view illustrating the first rigid hoard 11, the second rigid board 12, and a plurality of flexible boars 101 and 102 according to the sixth embodiment. In this embodiment, the semiconductor storage device 1 includes a plurality of flexible boards 101 and 102 (that is, first and second flexible boards 101 and 102) that connect the first rigid board 11 and the second rigid board 12. Each of the plurality of flexible boards 101 and 102 has substantially the same configuration as the flexible board 21 in the first embodiment.

For example, a first end portion 21a of the first flexible board 101 is fixed to the second principal surface S2 of the first rigid board 11. A second end portion 21b of the first flexible board 101 is fixed to the third principal surface S3 of the second rigid board 12.

On the other hand, a first end portion 21a of the second flexible board 102 is fixed to the second principal surface S2 of the first rigid board 11 at a position closer to the −X side than the first end portion 21a of the first flexible hoard 101. A second end portion 21b of the second flexible board 102 is fixed to the third principal surface S3 of the second rigid board 12 at a position which is closer to the −X side than the second end portion 21b of the first flexible board 101.

According to this configuration, it is possible to further increase the number of rows between the first rigid board 11 and the second rigid board 12 using a plurality of flexible boards 101 and 102.

Seventh Embodiment

A seventh embodiment will be described below. The seventh embodiment is different from the first embodiment, in that a plurality of rigid boards 111 and 112 having different thicknesses are connected by a flexible board 113. The other configuration which will be described below is the same as the configuration in the first embodiment.

Figure 19:
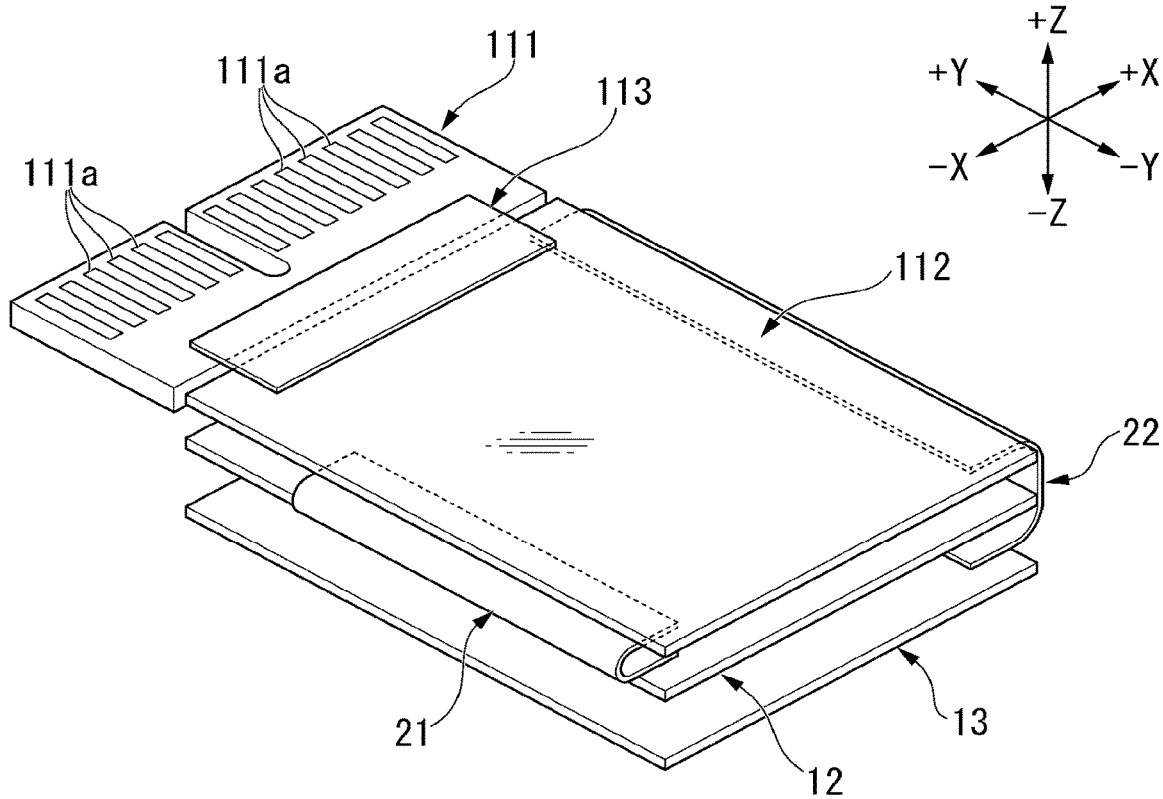
FIG. 19 is a perspective view illustrating a partial configuration of a semiconductor storage device according to a seventh embodiment.

FIG. 19 is a perspective view illustrating a partial configuration of a semiconductor storage device 1 according to the seventh embodiment. In this embodiment, an interface board (a first board) 111 and a controller-mounted board (a second board) 112 are provided instead of the first rigid board 11 in the first embodiment.

In the interface board 111, a connector for connection to a host device is formed by a plurality of metal terminals 111a which are disposed on a surface of the interface board 111. The interface board 111 is, for example, based on the standard of Half Height and Half Length (HHHL) of PCI Express (registered trademark). For example, the interface board 111 has a relatively large thickness of 1.57 mm.

On the other hand, a controller 14 and a DRAM 15 are mounted on the controller-mounted board 112. The controller-mounted board 112 is formed thinner than the interface board 111. The controller-mounted board 112 is connected to the interface board 111 via the flexible board 113. The controller-mounted board 112 is connected to the second and third rigid boards 12 and 13 via the first and second flexible boards 21 and 22. For example, the second and third rigid boards 12 and 13 overlap the controller-mounted board 112 in the Z direction.

According to this configuration, for example, in comparison with a case in which the first rigid board 11 in the first embodiment has a relatively large thickness (for example, a thickness based on the HHHL standard of PCI Express) as a whole, it is possible to achieve a decrease in thickness of the semiconductor storage device 1. From another viewpoint, it is possible to provide a semiconductor storage device 1 that includes a connector based on the HHHL standard of PCI Express and can achieve an increase in capacity.

Eighth Embodiment

An eighth embodiment will be described below. The eighth embodiment is different from the first embodiment, in that a plurality of rigid hoards 121 and 122 are provided instead of the third rigid board 13. The other configuration which will be described below is the same as the configuration in the first embodiment.

Figure 20:
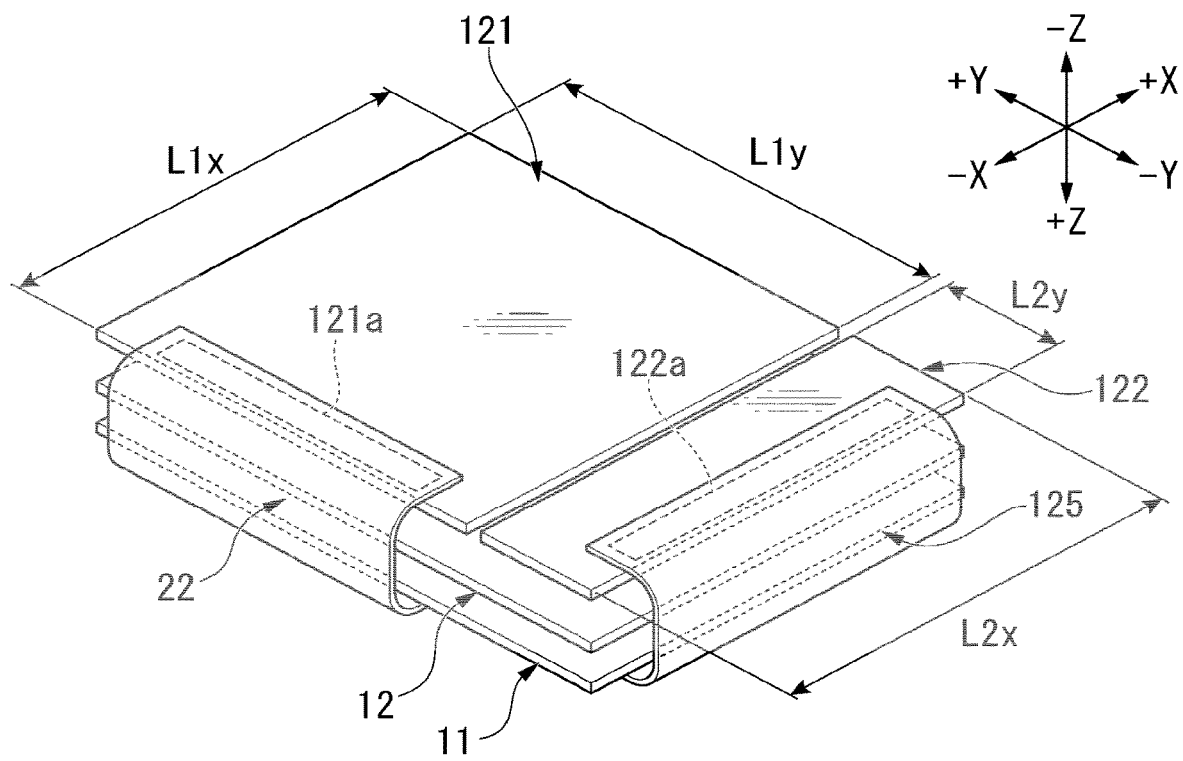
FIG. 20 is a perspective view illustrating a partial configuration of a semiconductor storage device according to an eighth embodiment.

FIG. 20 is a perspective view illustrating a partial configuration of a semiconductor storage device 1 according to the eighth embodiment. In this embodiment, the semiconductor storage device 1 includes a third rigid board 121 and a fourth rigid board 122 instead of the third rigid board 13 in the first embodiment. The third rigid board 121 and the fourth rigid board 122 are disposed at substantially the same position in the Z direction. A plurality of NANDs 16 are mounted on the third rigid board 121 and the fourth rigid board 122. The semiconductor storage device 1 includes a third flexible board 125 that connects the first rigid board 11 and the fourth rigid board 122 in addition to the second flexible board 22 that connects the first rigid board 11 and the third rigid board 121.

In this embodiment, the length L1y in the Y direction of the third rigid hoard 121 is larger than the length L2y in the Y direction of the fourth rigid board 122. The length L1y in the Y direction of the third rigid board 121 is larger than the length L1x in the X direction of the third rigid board 121. The third rigid board 121 includes a connection portion 121a that is connected to the second flexible board 22. The connection portion 121a includes a plurality of pads 30 similarly to the connection portion 11a of the first rigid board 11 in the first embodiment. The connection portion 121a is disposed in an end portion that is parallel to the Y direction of the third rigid board 121. Accordingly, in comparison with a case in which the connection portion 121a is provided in an end portion that is parallel to the X direction of the third rigid board 121, it is possible to secure the larger width of the second flexible board 22 and the connection portions 121a.

On the other hand, the length L2x in the X direction of the fourth rigid hoard 122 is larger than the length L2y in the Y direction of the fourth rigid board 122. The fourth rigid board 122 includes a connection portion 122a that is connected to the third flexible board 125. The connection portion 122a includes a plurality of pads 30 similarly to the connection portion 11a of the first rigid board 11 in the first embodiment. The connection portion 122a is disposed in an end portion that is parallel to the X direction of the fourth rigid board 122. Accordingly, in comparison with a case in which the connection portion 122a is provided in an end portion that is parallel to the Y direction of the fourth rigid board 122, it is possible to secure the larger width of the third flexible board 125 and the connection portions 122a.

According to this configuration, in comparison with a case in which the connection portion 13a is disposed along one side of the third rigid board 13 as in the first embodiment, it is possible to increase the number of rows between the first rigid hoard 11 and the third and fourth rigid hoards 121 and 122. Accordingly, it is possible to increase the number of NANDs 16 which are mounted on the third and fourth rigid boards 121 and 122 and to achieve a further increase in capacity of the semiconductor storage device 1.

Ninth Embodiment

A ninth embodiment will be described below. The ninth embodiment is different from the first embodiment, in that ventilation holes 131 are provided in the first flexible board 21. The other configuration which will be described below is the same as the configuration in the first embodiment.

Figure 21:
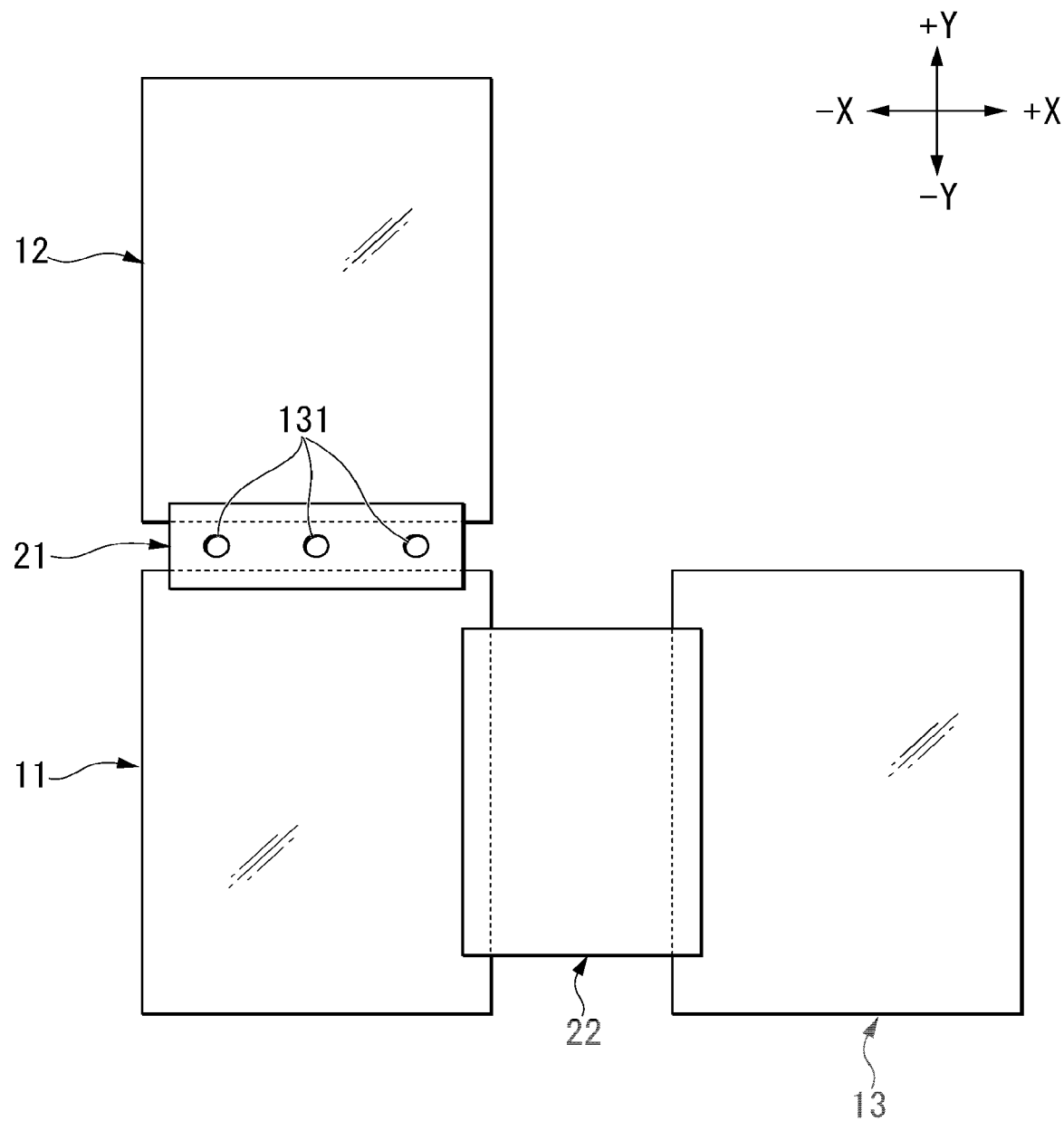
FIG. 21 is a plan view illustrating a partial configuration of a semiconductor storage device according to a ninth embodiment.

FIG. 21 is a plan view illustrating a semiconductor storage device 1 according to the ninth embodiment. FIG. 21 illustrates a state in which the first and second flexible boards 21 and 22 are stretched flat. In this embodiment, the first flexible board 21 connects one end portion in the Y direction of the first rigid hoard 11 and one end portion in the Y direction of the second rigid board 12. The first flexible board 21 faces the ventilation holes h of the housing 10 in the Y direction in a state in which it is bent and disposed in the housing 10.

Therefore, in this embodiment, a plurality of ventilation holes 131 are provided in the first flexible board 21. The plurality of ventilation holes 131 are opened in the Y direction in a state in which the first flexible board 21 is bent in the housing 10. The plurality of ventilation holes 131 communicate with the ventilation holes h of the housing 10.

According to this configuration, even when the first flexible board 21 faces the ventilation holes h of the housing 10, it is possible to curb a decrease in heat flowability in the housing 10.

Tenth Embodiment

A tenth embodiment will be described below. The tenth embodiment is different from the first embodiment, in that first and second rigid-flexible boards 141 and 142 are provided instead of the first and second flexible boards 21 and 22. The other configuration which will be described below is the same as the configuration in the first embodiment.

Figure 22:
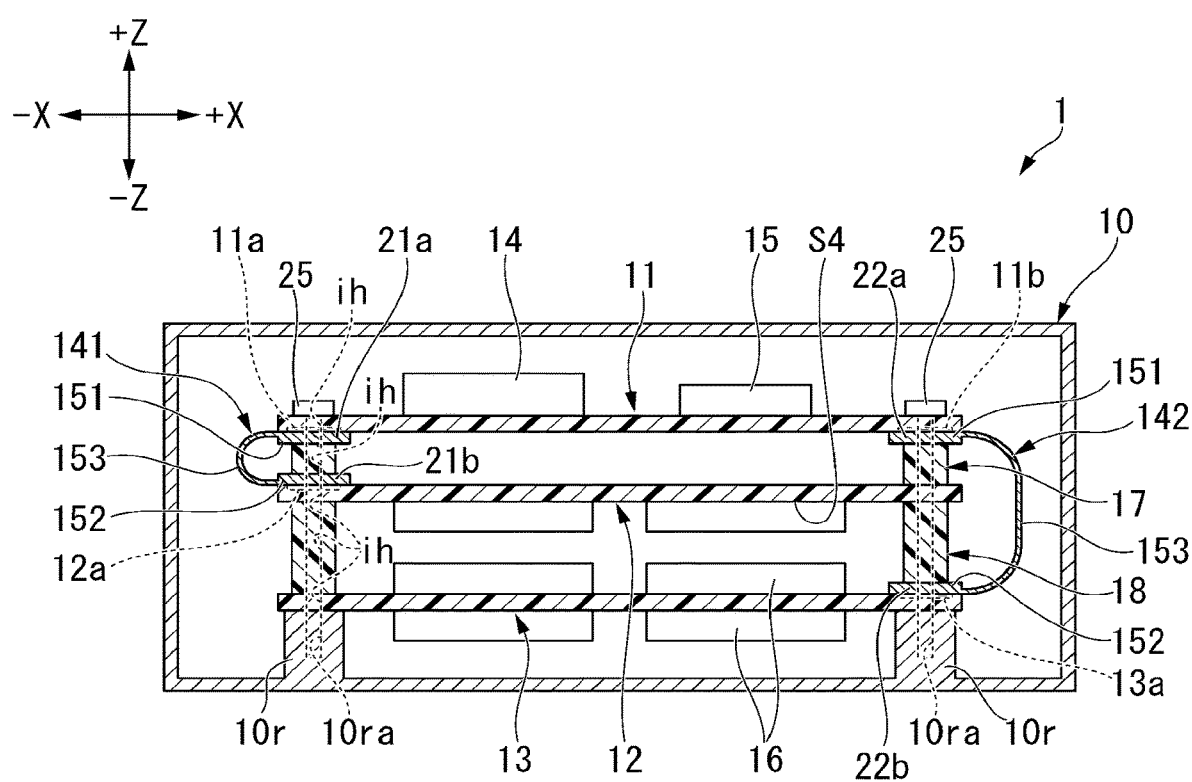
FIG. 22 is a sectional view illustrating a semiconductor storage device according to a tenth embodiment.

FIG. 22 is a sectional view illustrating a semiconductor storage device 1 according to the tenth embodiment. Each of the first and second rigid-flexible boards 141 and 142 includes first and second rigid portions 151 and 152 and a flexible portion 153 that connects the first and second rigid portions 151 and 152. Each of the first and second rigid portions 151 and 152 includes a hard insulator and a conductor pattern that is formed in the insulator. The flexible portion 153 includes a flexible insulating film and a conductor pattern which is covered with the insulating film.

The first rigid-flexible hoard 141 includes a first end portion 21a which is formed by the first rigid portion 151 and a second end portion 21b which is formed by the second rigid portion 152. The first end portion 21a is fixed to the second principal surface S2 of the first rigid board 11. The second end portion 21b is fixed to the third principal surface S3 of the second rigid board 12. The first rigid-flexible board 141 is another example of a "first connection board."

Similarly, the second rigid-flexible board 142 includes a first end portion 22a which is formed by the first rigid portion 151 and a second end portion 22b which is formed by the second rigid portion 152. The first end portion 22a is fixed to the second principal surface S2 of the first rigid board 11. The second end portion 22b is fixed to the third principal surface S3 of the third rigid board 13. The second rigid-flexible board 142 is another example of a "second connection board."

With this configuration, similarly to the first embodiment, it is possible to provide a semiconductor storage device 1 that can achieve an increase in capacity and improvement in repairability.

While some embodiments have been described above, the invention is not limited to the embodiments. For example, the flexible boards 21 and 22 may be fixed to the rigid boards 11, 12, and 13 using an ACF or the like instead of the solder portions.

According to at least one of the above-mentioned embodiments, a semiconductor storage device includes a connection board that includes a first end portion fixed to a surface of a first rigid board and a second end portion fixed to a surface of a second rigid board and is disposed in the housing in a state in which at least a part thereof is bent. According to this configuration, it is possible to provide a semiconductor storage device that can achieve an increase in capacity and improvement in repairability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a housing;
a first rigid board in the housing, the first rigid board comprising a plurality of first terminals on a surface of the first rigid board;
a controller on the first rigid board;
a second rigid board in the housing, the second rigid board facing at least in part the first rigid board, the second rigid board comprising a plurality of second terminals on a surface of the second rigid board;
a first semiconductor memory component on the second rigid board, the first semiconductor memory component being configured to be controlled by the controller; and
a first connection board in the housing in a state in which at least a part of the first connection board is bent, the first connection board comprising a first end portion and a second end portion, the first end portion comprising a plurality of third terminals connected to the plurality of first terminals of the first rigid board, the second end portion comprising a plurality of fourth terminals connected to the plurality of second terminals of the second rigid board,
wherein
the surface of the first rigid board comprises a first surface facing the second rigid board,
the first surface comprises the plurality of first terminals, and
the first end portion of the first connection board is fixed to the plurality of first terminals of the first surface of the first rind board.

2. The semiconductor storage device according to claim 1, wherein
the plurality of third terminals of the first connection board are connected to the plurality of first terminals of the first rigid board by a plurality of first solder portions, and
the plurality of fourth terminals of the first connection board are connected to the plurality of second terminals of the second rigid board by a plurality of second solder portions.

3. The semiconductor storage device according to claim 1, further comprising:
a third rigid board in the housing, the third rigid board being on a side opposite to the first rigid board with respect to the second rigid board;
a second semiconductor memory component on the third rigid board, the second semiconductor memory component being configured to be controlled by the controller; and
a second connection board,
wherein
the first rigid board comprises a plurality of fifth terminals on the surface of the first rigid board,
the third rigid board comprises a plurality of sixth terminals on a surface of the third rigid board, and
the second connection board is in the housing in a state in which at least a part of the second connection board is bent, the second connection board comprises a first end portion and a second end portion, the first end portion comprising a plurality of seventh terminals connected to the plurality of fifth terminals of the first rigid board, the second end portion comprising a plurality of eighth terminals connected to the plurality of sixth terminals of the third rigid board.

4. The semiconductor storage device according to claim 1, wherein
the surface of the second rigid board comprises a second surface facing the first rigid board, and
the second surface comprises the plurality of second terminals, and
the second end portion of the first connection board is fixed to the plurality of second terminals of the second surface of the second rigid board.

5. The semiconductor storage device according to claim 1, further comprising
a supporter between the first rigid board and the second rigid board, the supporter facing the first end portion of the first connection board from a side opposite to the first rigid board.

6. A semiconductor storage device comprising:
a housing;
a first rigid board in the housing, the first rigid board comprising a plurality of first terminals on a surface of the first rigid board;
a controller on the first rigid board;
a second rigid board in the housing, the second rigid board facing at least in part the first rigid board, the second rigid board comprising a plurality of second terminals on a surface of the second rigid board;

a first semiconductor memory component on the second rigid board, the first semiconductor memory component being configured to be controlled by the controller; and a first connection board in the housing in a state in which at least a part of the first connection board is bent, the first connection board comprising a first end portion and a second end portion, the first end portion comprising a plurality of third terminals connected to the plurality of first terminals of the first rigid board, the second end portion comprising a plurality of fourth terminals connected to the plurality of second terminals of the second rigid board, wherein the first connection board comprises a plurality of signal lines and a planar ground layer, the ground layer is closer to an outer side of the first connection board than the plurality of signal lines in a state in which the first connection board is bent, and the ground layer covers at least a part of each of the plurality of signal lines.

7. A semiconductor storage device comprising:
a housing;
a first rigid board in the housing, the first rigid board comprising a plurality of first terminals on a surface of the first rigid board;
a controller on the first rigid board;
a second rigid board in the housing, the second rigid board facing at least in part the first rigid board, the second rigid board comprising a plurality of second terminals on a surface of the second rigid board;
a first semiconductor memory component on the second rigid board, the first semiconductor memory component being configured to be controlled by the controller; and
a first connection board in the housing in a state in which at least a part of the first connection board is bent, the first connection board comprising a first end portion and a second end portion, the first end portion comprising a plurality of third terminals connected to the plurality of first terminals of the first rigid board, the second end portion comprising a plurality of fourth terminals connected to the plurality of second terminals of the second rigid board,
wherein
the plurality of first terminals are a plurality of pads to which a plurality of solder portions are bonded,
the plurality of pads includes pads in a first row and pads in a second row, the first row being along a first direction, the second row being separated from the first row in a second direction that is different from the first direction, the second row being along the first direction, and
the plurality of third terminals of the first end portion of the first connection board comprises terminals connected to the pads in the first row and terminals connected to the pads in the second row.

8. The semiconductor storage device according to claim 7, wherein
the first row and the second row are parallel to an edge of the first rigid board, and
the second row is on a side opposite to the edge of the first rigid board with respect to the first row.

9. The semiconductor storage device according to claim 7, wherein
the plurality of pads further includes pads in a third row, the third row being on a side opposite to the first row in the second direction with respect to the second row, and the plurality of third terminals of the first end portion of the first connection board further includes terminals connected to the pads in the third row.

10. The semiconductor storage device according to claim 7, wherein
at least one of the pads in the first row is larger than at least one of pads in the second row.

11. The semiconductor storage device according to claim 7, wherein
the pads in the first row includes a first pad, a second pad, and a third pad arranged in this order in the first direction,
the pads in the second row includes a fourth pad and a fifth pad,
a position of the fourth pad in the first direction corresponds to a position between the first pad and the second pad, and a position of the fifth pad in the first direction corresponds to a position between the second pad and the third pad.

12. The semiconductor storage device according to claim 11, wherein
the plurality of pads further includes a third pads in a third row, the third row being on a side opposite to the first row in the second direction with respect to the second row,
the pads in the third row includes a sixth pad, a seventh pad, and an eighth pad arranged in this order in the first direction, and
a position of the sixth pad in the first direction corresponds to a position of the first pad in the first direction, a position of the seventh pad in the first direction corresponds to a position of the second pad in the first direction, and a position of the eighth pad in the first direction corresponds to a position of the third pad in the first direction.

13. The semiconductor storage device according to claim 12, wherein
the second pad, the fourth pad, and the sixth pad are arranged in this order in a third direction that is different from the first direction and the second direction, and
the third pad, the fifth pad, and the seventh pad are arranged in this order in the third direction.

14. The semiconductor storage device according to claim 7, wherein
the plurality of third terminals are pad that face the plurality of pads of the first rigid board,
the first connection board comprises a light-transmitting insulator that covers the plurality of pads of the first connection board, and
at least one of the plurality of pads of the first connection board is smaller than at least one of the plurality of pads of the first rigid board.

15. The semiconductor storage device according to claim 14, wherein
the first connection board comprises a plurality of signal lines and a planar ground layer, the ground layer is closer to an outer side of the first connection board than the plurality of signal lines in a state in which the first connection board is bent, and the ground layer covers at least a part of each of the plurality of signal lines,
the plurality of pads of the first connection board comprises signal pads and ground pads, the signal pads facing the pads in the second row and being electrically connected to the plurality of signal lines, the ground pads facing the pads in the first row and being electrically connected to the ground layer, and at least one of the plurality of signal lines extends over a position which overlaps at least one of the plurality of ground pads in a thickness direction of the first connection board.

* * * * *